US012581744B2

(12) United States Patent
Yakubo et al.

(10) Patent No.: US 12,581,744 B2
(45) Date of Patent: Mar. 17, 2026

(54) SEMICONDUCTOR DEVICE

(71) Applicant: SEMICONDUCTOR ENERGY LABORATORY CO., LTD., Atsugi (JP)

(72) Inventors: Yuto Yakubo, Atsugi (JP); Shoki Miyata, Atsugi (JP); Akio Suzuki, Atsugi (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 812 days.

(21) Appl. No.: 17/996,516

(22) PCT Filed: Apr. 9, 2021

(86) PCT No.: PCT/IB2021/052940
§ 371 (c)(1),
(2) Date: Oct. 19, 2022

(87) PCT Pub. No.: WO2021/214583
PCT Pub. Date: Oct. 28, 2021

(65) Prior Publication Data
US 2023/0207567 A1 Jun. 29, 2023

(30) Foreign Application Priority Data
Apr. 23, 2020 (JP) ................................. 2020-076423

(51) Int. Cl.
*H10D 87/00* (2025.01)
*H10D 30/67* (2025.01)

(52) U.S. Cl.
CPC ........... *H10D 87/00* (2025.01); *H10D 30/675* (2025.01); *H10D 30/6755* (2025.01)

(58) Field of Classification Search
CPC .. H10D 87/00; H10D 30/675; H10D 30/6755; H10D 30/6757; H10D 30/6734;
(Continued)

(56) References Cited

U.S. PATENT DOCUMENTS 8,338,827 B2 12/2012 Yamazaki et al.
8,987,833 B2 3/2015 McDonald et al.
(Continued)

FOREIGN PATENT DOCUMENTS

CN 107924873 A 4/2018
JP 07-202585 A 8/1995
(Continued)

OTHER PUBLICATIONS

International Search Report (Application No. PCT/IB2021/052940) Dated Jul. 20, 2021 .
(Continued)

*Primary Examiner* — Monica D Harrison
(74) *Attorney, Agent, or Firm* — Fish & Richardson P.C.

(57) ABSTRACT
A semiconductor device with a novel structure is provided. The semiconductor device includes a current-to-voltage conversion portion, a current switch portion, a voltage-to-current conversion portion, and a control portion. The current switch portion includes a first transistor. The voltage-to-current conversion portion includes a second transistor. The control portion includes a third transistor. The first transistor includes an oxide semiconductor in a channel formation region. The second transistor includes a nitride semiconductor in a channel formation region. The third transistor includes silicon in a channel formation region. The first transistor is provided over a first substrate. The second transistor and the third transistor are provided over a second substrate.

18 Claims, 21 Drawing Sheets

(58) Field of Classification Search
CPC .. H10D 86/423; H10D 84/00; H10D 84/0126;
H10D 84/038; H10D 86/60; H10D 99/00;
H10D 84/01; H10D 88/00; Y02B 70/10
USPC ......................................................... 257/43
See application file for complete search history.

(56) References Cited

U.S. PATENT DOCUMENTS

| | | | |
|---|---|---|---|
| 9,343,440 B2 | 5/2016 | McDonald et al. | |
| 9,362,267 B2 | 6/2016 | Briere et al. | |
| 9,455,709 B2 | 9/2016 | Ohmaru et al. | |
| 9,755,633 B2 | 9/2017 | Kimura et al. | |
| 10,033,371 B2 | 7/2018 | Kimura et al. | |
| 10,438,942 B2 | 10/2019 | Maehara et al. | |
| 10,673,432 B1 * | 6/2020 | Kaya | H02M 3/158 |
| 11,405,033 B2 * | 8/2022 | Xie | H03K 17/005 |
| 2012/0256190 A1 | 10/2012 | McDonald. et al. | |
| 2013/0175542 A1 | 7/2013 | Briere et al. | |
| 2018/0240797 A1 | 8/2018 | Yokoyama et al. | |
| 2021/0074702 A1 | 3/2021 | Le et al. | |
| 2022/0216830 A1 | 7/2022 | Ohshima et al. | |
| 2022/0416124 A1 | 12/2022 | Tanemura et al. | |

FOREIGN PATENT DOCUMENTS

| | | |
|---|---|---|
| JP | 10-242763 A | 9/1998 |
| JP | 11-027170 A | 1/1999 |
| JP | 2009-182860 A | 8/2009 |
| JP | 2012-222360 A | 11/2012 |
| JP | 2017-143127 A | 8/2017 |
| KR | 2018-0048613 A | 5/2018 |
| WO | WO-2017/038403 | 3/2017 |
| WO | WO-2019/066872 | 4/2019 |
| WO | WO-2020/240348 | 12/2020 |

OTHER PUBLICATIONS

Written Opinion (Application No. PCT/IB2021/052940) Dated Jul. 20, 2021.

* cited by examiner

Time

FIG. 8A
FIG. 8B
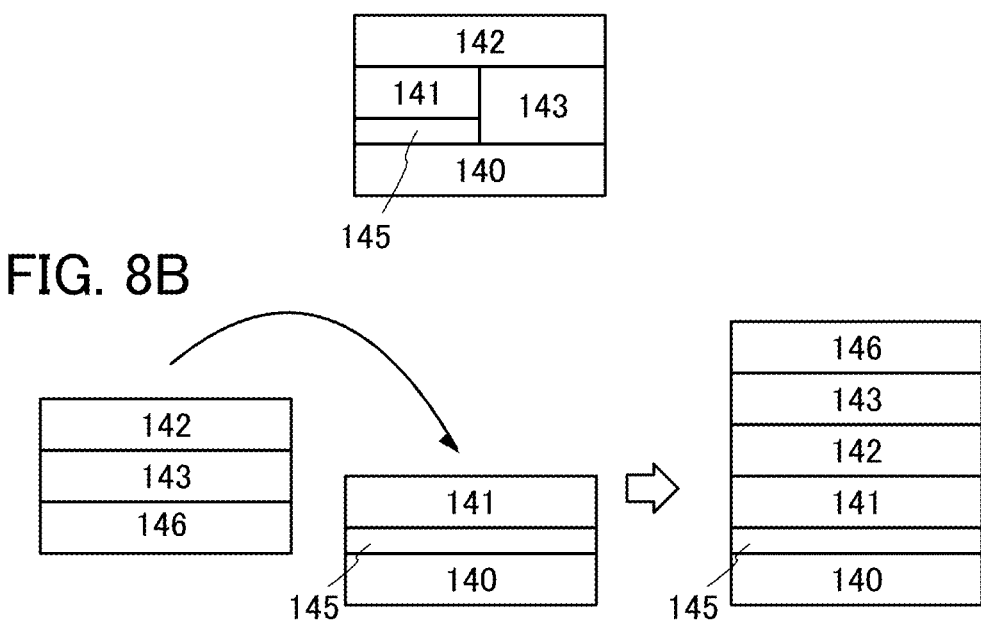
FIG. 8C
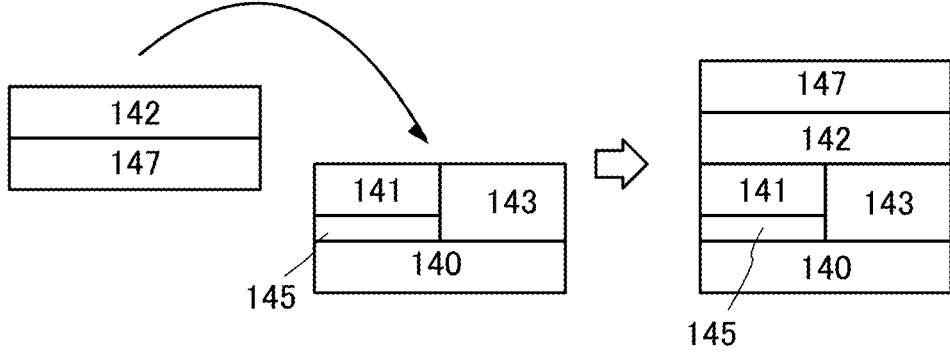

500A

500A

500A

500B

500B

500B

FIG. 15A
Intermediate state
New crystalline phase
| Amorphous | Crystalline | Crystal |
|-----------|-------------|---------|
| •completely amorphous | •CAAC<br>•nc<br>•CAC<br><br>excluding single crystal and poly crystal | •single crystal<br>•poly crystal |
FIG. 15B
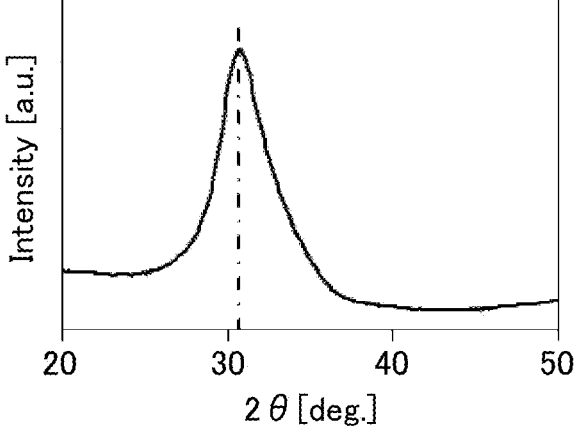
FIG. 15C
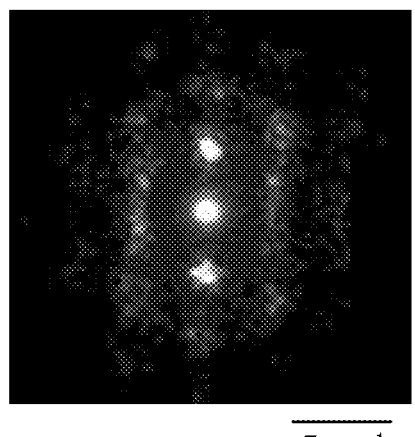
5nm⁻¹

711

713

712

714

715

715

712

713

```
        START

BACK SURFACE
  GRINDING        S721

DICING         S722

DIE BONDING      S723

WIRE BONDING     S724

SEALING        S725

LEAD PLATING     S726

MOLD
 FABRICATION      S727

MARKING        S728

INSPECTION      S729

END
```

SEMICONDUCTOR DEVICE

CROSS REFERENCE TO RELATED APPLICATIONS

This application is a U.S. National Phase Application under 35 U.S.C. § 371 of International Application PCT/IB2021/052940, filed on Apr. 9, 2021, which is incorporated by reference and claims the benefit of a foreign priority application filed in Japan on Apr. 23, 2020, as Application No. 2020-076423.

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter.

Note that in this specification and the like, a semiconductor device generally means a device that can function by utilizing semiconductor characteristics. Thus, a semiconductor element such as a transistor or a diode and a circuit including a semiconductor element are semiconductor devices. In addition, a display device, a light-emitting device, a lighting device, an electro-optical device, an imaging device, a communication device, an electronic device, or the like may include a semiconductor element or a semiconductor circuit. Therefore, a display device, a light-emitting device, a lighting device, an electro-optical device, an imaging device, a communication device, an electronic device, or the like is sometimes called a semiconductor device.

BACKGROUND ART

As a switching device for high-speed operation, a transistor with high mobility typified by gallium nitride is used. A transistor including a nitride of Group 13 element, such as gallium nitride (GaN), in a channel formation region (hereinafter, a GaN transistor) operates in a depletion mode (normally on).

To achieve high performance, it is desirable to employ a structure where a GaN transistor is combined with a transistor including a different semiconductor material, for example, a transistor including silicon (Si) in a channel formation region (a Si transistor), or the like. For example, Patent Document 1 discloses a switching device that can operate in an enhancement mode (normally off) by a combination of a depletion mode GaN transistor with a Si transistor.

REFERENCE

Patent Document

[Patent Document 1] Japanese Published Patent Application No. 2012-222360

SUMMARY OF THE INVENTION

Problems to be Solved by the Invention

With an increase in transmission speed or the like, an increase in switching speed of a switching device is also required. In a mixer circuit that is used for a transmitter/receiver circuit of a communication device, a signal obtained by multiplication of signals with different frequencies is generated.

A mixer circuit (also referred to as an active mixer) using a gilbert cell (also referred to as a gilbert circuit) includes a current-to-voltage (I/V) conversion portion, a current switch portion, and a voltage-to-current (VII) conversion portion (also referred to as an amplification portion). A GaN transistor that allows large current to flow is used as a transistor of the voltage-to-current conversion portion. The GaN transistor is a normally-on transistor where current is likely to flow when the transistor is off. Therefore, by employing a normally-off Si transistor where current is less likely to flow when the transistor is off for the current switch portion, current flowing when the transistor is off (leakage current) is suppressed.

However, there is a possibility that leakage current might increase both in the GaN transistor and the Si transistor in a high-temperature environment. The increase in leakage current might cause an increase in power consumption. Furthermore, an increase in leakage current in the switching device might lead to malfunction.

An object of one embodiment of the present invention is to provide a semiconductor device or the like with a novel structure. Another object is to provide a semiconductor device or the like that is excellent in reducing power consumption. Another object is to provide a semiconductor device or the like with high operational reliability.

Note that the description of these objects does not preclude the existence of other objects. Note that in one embodiment of the present invention, there is no need to achieve all the objects. Note that other objects will be apparent from the description of the specification, the drawings, the claims, and the like, and other objects can be derived from the description of the specification, the drawings, the claims, and the like

Means for Solving the Problems

One embodiment of the present invention is a semiconductor device that includes a current-to-voltage conversion portion, a current switch portion, and a voltage-to-current conversion portion. The current switch portion includes a first transistor. The voltage-to-current conversion portion includes a second transistor. The first transistor includes an oxide semiconductor in a channel formation region. The second transistor includes a nitride semiconductor in a channel formation region. The first transistor is provided in a layer above a layer where the second transistor is provided.

One embodiment of the present invention is a semiconductor device that includes a current-to-voltage conversion portion, a current switch portion, a voltage-to-current conversion portion, and a control portion. The current switch portion includes a first transistor. The voltage-to-current conversion portion includes a second transistor. The control portion includes a third transistor. The first transistor includes an oxide semiconductor in a channel formation region. The second transistor includes a nitride semiconductor in a channel formation region. The third transistor includes silicon in a channel formation region. The first transistor is provided in a layer above a layer where the second transistor and the third transistor are provided.

One embodiment of the present invention is a semiconductor device that includes a current-to-voltage conversion portion, a current switch portion, a voltage-to-current conversion portion, and a control portion. The current switch portion includes a first transistor. The voltage-to-current conversion portion includes a second transistor. The control portion includes a third transistor. The first transistor includes an oxide semiconductor in a channel formation region. The second transistor includes a nitride semiconductor in a channel formation region. The third transistor includes silicon in a channel formation region. The first transistor is provided over a first substrate. The second transistor and the third transistor are provided over a second substrate. When the first substrate is attached to the second substrate, the first transistor to the third transistor are electrically connected.

In one embodiment of the present invention, the semiconductor device in which the current-to-voltage conversion portion includes a resistor is preferable.

In one embodiment of the present invention, the semiconductor device is preferable in which the voltage-to-current conversion portion includes a fourth transistor and an inductor, one of a source and a drain of the fourth transistor is electrically connected to a first terminal of the inductor, a second terminal of the inductor is electrically connected to a gate of the second transistor, and the fourth transistor includes an oxide semiconductor in a channel formation region.

In one embodiment of the present invention, the semiconductor device is preferable in which frequency of a signal supplied to a gate of the first transistor is higher than frequency of a signal supplied to the gate of the second transistor.

In one embodiment of the present invention, the semiconductor device in which the oxide semiconductor contains In, Ga, and Zn is preferable.

In one embodiment of the present invention, the semiconductor device in which the nitride semiconductor contains Ga is preferable.

Note that other embodiments of the present invention will be shown in the description of the following embodiments and the drawings.

Effect of the Invention

According to one embodiment of the present invention, a semiconductor device or the like with a novel structure can be provided. Alternatively, a semiconductor device or the like that is excellent in reducing power consumption can be provided. Alternatively, a semiconductor device or the like with high operational reliability can be provided.

Note that the description of these effects does not preclude the existence of other effects. Note that one embodiment of the present invention does not need to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 2A and FIG. 2B are diagrams illustrating structure examples of a semiconductor device.

FIG. 3A and FIG. 3B are diagrams illustrating structure examples of a semiconductor device.

FIG. 4A and FIG. 4B are diagrams illustrating structure examples of a semiconductor device.

FIG. 8A to FIG. 8C are diagrams illustrating structure examples of a semiconductor device.

FIG. 15A is a diagram showing classifications of crystal structures of IGZO. FIG. 15B is a diagram showing an XRD spectrum of a CAAC-IGZO film. FIG. 15C is a diagram showing nanobeam electron diffraction patterns of a CAAC-IGZO film.

MODE FOR CARRYING OUT THE INVENTION

Figure 1:
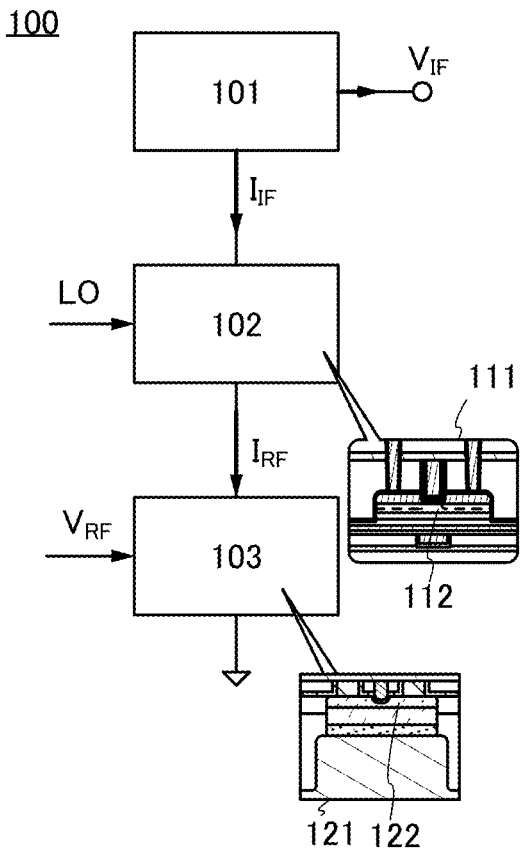
FIG. 1 is a diagram illustrating a structure example of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first," "second," and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Alternatively, in this specification and the like, for example, a "first" component in one embodiment can be omitted in other embodiments or claims.

The same components, components having similar functions, components made of the same material, components formed at the same time, and the like in the drawings are denoted by the same reference numerals, and repeated description thereof is skipped in some cases.

In this specification, for example, a power supply potential VDD is sometimes abbreviated as a potential VDD, VDD, or the like. The same applies to other components (e.g., a signal, voltage, a circuit, an element, an electrode, a wiring, and the like).

In addition, in the case where a plurality of components are denoted by the same reference numerals, and in particular need to be distinguished from each other, an identification sign such as "_1," "_2," "[n]," or "[m,n]" is sometimes added to the reference numerals. For example, a second wiring GL is referred to as a wiring GL[2].

Embodiment 1

A semiconductor device according to one embodiment of the present invention will be described using drawings. FIG. 1 is a diagram for illustrating a semiconductor device 100 that functions as a mixer circuit (also referred to as an active mixer) using a gilbert cell (also referred to as a gilbert circuit) according to one embodiment of the present invention. The semiconductor device 100 includes a current-to-voltage conversion portion 101, a current switch portion 102, and a voltage-to-current conversion portion 103 (also referred to as an amplification portion).

The current-to-voltage conversion portion 101 has a function of converting flowing current IF into voltage and outputting the voltage as a signal $V_{IF}$. The current-to-voltage conversion portion 101 can include a resistor or the like. The resistor can include a semiconductor layer of silicon or the like. Note that the current-to-voltage conversion portion 101 is sometimes referred to as a current-to-voltage conversion circuit or simply referred to as a circuit.

The current switch portion 102 functions as a switch for changing whether to interrupt current flowing between the current-to-voltage conversion portion 101 and the voltage-to-current conversion portion 103 in accordance with a signal LO. The signal LO is a signal with given frequency that is output from an oscillation circuit or the like. When the current switch portion 102 interrupts the current in accordance with the signal LO, the signal $V_{IF}$ that is obtained by conversion of the frequency of a signal $V_{RF}$ supplied to the voltage-to-current conversion portion 103 can be output from the current-to-voltage conversion portion 101. Note that the current switch portion 102 is sometimes referred to as a current switch circuit or simply referred to as a circuit.

The current switch portion 102 includes a transistor 111 that functions as a switch capable of interrupting the current. A transistor (an OS transistor) in which a semiconductor layer 112 including a channel formation region is an oxide semiconductor (also referred to as a metal oxide) is suitable for the transistor 111. Note that the operation and the like of the OS transistor, which is an n-channel transistor, are described.

An oxide semiconductor has a band gap of more than or equal to 2.5 eV; thus, an OS transistor has extremely low off-state current. For example, off-state current per micrometer in channel width at a source-drain voltage of 3.5 V and room temperature (25° C.) can be lower than $1 \times 10^{-20}$ A, lower than $1 \times 10^{-22}$ A, or lower than $1 \times 10^{-24}$ A. That is, in the current switch portion 102, leakage current flowing when the transistor is off can be extremely low.

A highly integrated semiconductor device generates heat due to circuit drive in some cases. This heat makes the temperature of a transistor rise to change the characteristics of the transistor, and field-effect mobility thereof might change or operating frequency thereof might decrease, for example. Since an OS transistor has higher heat resistance than a Si transistor, a change in field-effect mobility and a decrease in operating frequency due to a temperature change do not easily occur. In addition, even when the temperature becomes high, an OS transistor is likely to keep a property of drain current increasing exponentially with respect to gate-source voltage. Thus, the use of an OS transistor enables stable operation in a high-temperature environment.

Examples of an oxide semiconductor that is applied to an OS transistor include a Zn oxide, a Zn—Sn oxide, a Ga—Sn oxide, an In—Ga oxide, an In—Zn oxide, an In-M-Zn oxide (M is Ti, Ga, Y, Zr, La, Ce, Nd, Sn, or Hf), and the like. The use of an oxide semiconductor using Ga as M for the OS transistor is particularly preferable because electrical characteristics such as field-effect mobility of the transistor can be made excellent by adjusting the ratio of elements. In addition, an oxide containing indium and zinc may contain one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the oxide semiconductor applied to the semiconductor layer be an oxide semiconductor having a crystal portion such as CAAC-OS, CAC-OS, or nc-OS. CAAC-OS is an abbreviation for c-axis-aligned crystalline oxide semiconductor. CAC-OS is an abbreviation for cloud-aligned composite oxide semiconductor. Nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. Separation between the function of allowing electrons to flow and the function of not allowing electrons to flow can maximize each function. In other words, when the CAC-OS is used for a channel formation region of an OS transistor, high on-state current and extremely low off-state current can be both achieved.

Avalanche breakdown or the like is less likely to occur in some cases in an OS transistor than in a general Si transistor because, for example, an oxide semiconductor has a wide band gap and thus electrons are less likely to be excited, and the effective mass of a hole is large. Therefore, for example, it is possible to inhibit hot-carrier degradation or the like that is caused by avalanche breakdown. Since hot-carrier degradation can be inhibited, an OS transistor can be driven at high drain voltage.

An OS transistor is an accumulation mode transistor in which electrons are majority carriers. Therefore, DIBL (Drain-Induced Barrier Lowering), which is one of the short-channel effects, affects an OS transistor less than an inversion transistor having a pn junction (typically a Si transistor). In other words, an OS transistor has higher resistance against short channel effects than a Si transistor.

Owing to its high resistance against short channel effects, an OS transistor can have reduced channel length without degradation in reliability, which means that the use of an OS transistor can increase the degree of circuit integration. Although miniaturization of channel length enhances a drain electric field, avalanche breakdown is less likely to occur in an OS transistor than in a Si transistor as described above.

In addition, since an OS transistor has high resistance against short-channel effects, a gate insulating film can be thicker than that of a Si transistor. For example, even in a minute transistor whose channel length and channel width are each less than or equal to 50 nm, a gate insulating film as thick as approximately 10 nm can be provided in some cases. When the gate insulating film is thick, parasitic capacitance can be reduced and thus circuit operating speed can be improved. Furthermore, when the gate insulating film is thick, leakage current through the gate insulating film is reduced, resulting in a reduction in static current consumption.

Accordingly, owing to inclusion of the OS transistor, the current switch portion 102 can reduce current flowing when the transistor is off (leakage current). In addition, a layer including the OS transistor can be provided to overlap a layer including other transistors. That is, the current switch portion 102 can be provided to be stacked over a layer including transistors forming the current-to-voltage conversion portion 101 and the voltage-to-current conversion portion 103. Consequently, the current switch portion 102 can be provided without an increase in the circuit area. In other words, the circuit area where the transistors can be arranged is increased, so that the amount of current flowing through the transistor in the current switch portion 102 can be increased.

The voltage-to-current conversion portion 103 has a function of converting the signal $V_{RF}$ into current so that the current is set to current $I_{RF}$. The current $I_{RF}$ is current controlled to be interrupted or not by the current switch portion 102. The signal $V_{RF}$ is a signal supplied from the outside. The frequency of the signal $V_{RF}$ is higher than the frequency of the signal LO. That is, the voltage-to-current conversion portion 103 has a function of allowing the current $I_{RF}$ to flow in accordance with the signal $V_{RF}$ with the high frequency. Note that the voltage-to-current conversion portion 103 is sometimes referred to as a voltage-to-current conversion circuit or simply referred to as a circuit.

The voltage-to-current conversion portion 103 includes a transistor 121 that allows the current $I_{RF}$ to flow in accordance with the voltage of the signal $V_{RF}$. A transistor (a GaN transistor) in which a semiconductor layer 122 including a channel formation region includes a nitride semiconductor containing a Group 13 element (gallium or the like) in the channel formation region is suitable for the transistor 121. Typically, a transistor containing gallium nitride (hereinafter, GaN) in a channel formation region is employed. Note that although description is made by giving an example of a transistor containing GaN in a channel formation region as the GaN transistor, AlGaN or AlN may be employed. Alternatively, a transistor with high mobility using a material other than the nitride semiconductor may be used, and a transistor containing SiC or the like in a channel formation region may be used.

In the case where the semiconductor layer 122 is GaN, a structure where GaN and AlGaN are stacked is preferable. Aluminum nitride (AlN) has outstanding material properties of a bandgap (6.2 eV) approximately twice as large as the bandgap of GaN (3.4 V), an electrostatic breakdown field (12 MV/cm) approximately four times as high as the electrostatic breakdown field of GaN (3.3 MV/cm), and thermal conductivity (2.9 W/cmK) approximately 1.5 times as high as the thermal conductivity of GaN (2 W/cmK). AlGaN, which is a mixed crystal of AlN and GaN, is preferable as a material for a high-output and high-frequency device. A HEMT (High Electron Mobility Transistor) whose channel formation region is AlGaN can operate at higher breakdown voltage than a HEMT whose channel formation region is GaN. Note that a two-dimensional electron gas (2DEG) can be generated at an interface between GaN and AlGaN due to the polarization effect of GaN and AlGaN; thus, the transistor can be used as a transistor with high mobility.

Figures 2A, 2B:
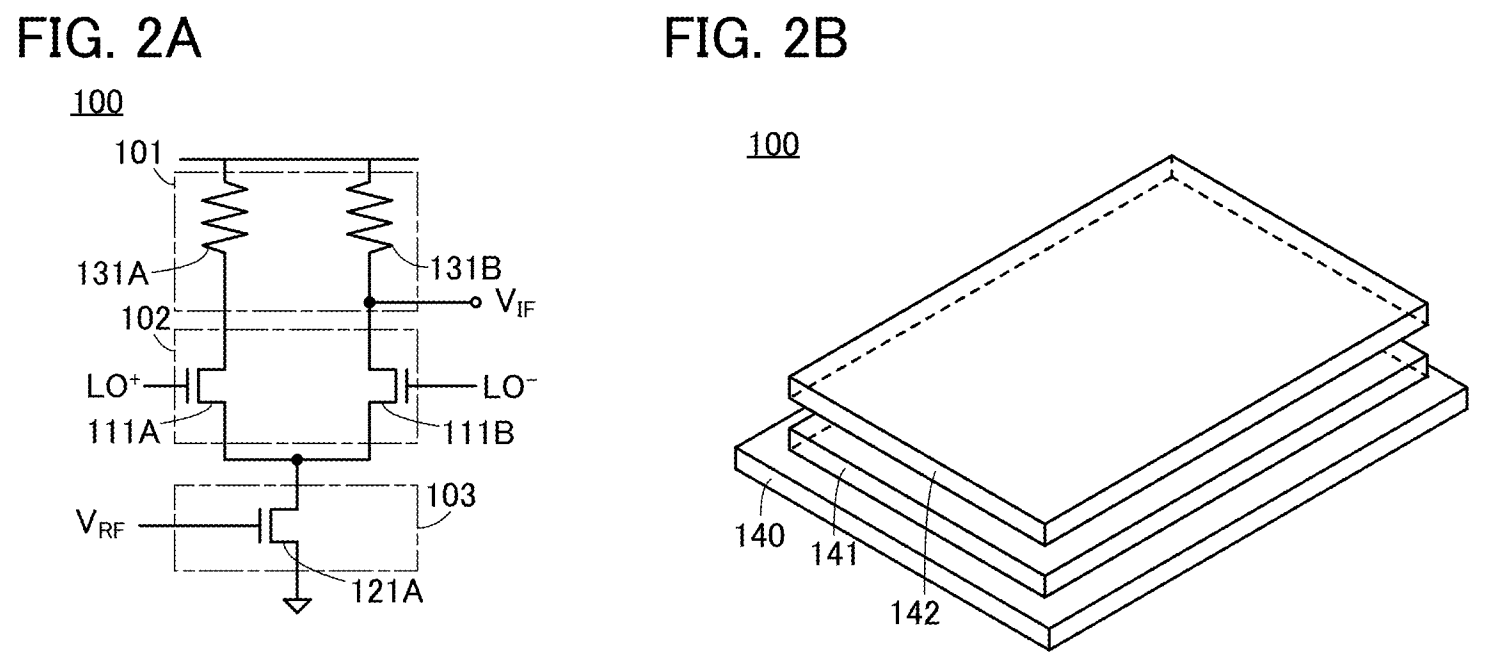

FIG. 2A is a diagram for illustrating a specific structure example of the semiconductor device 100 according to one embodiment of the present invention. As described in FIG. 1, the semiconductor device 100 includes the current-to-voltage conversion portion 101, the current switch portion 102, and the voltage-to-current conversion portion 103.

The current-to-voltage conversion portion 101 includes a resistor 131A and a resistor 131B. The current switch portion 102 includes a transistor 111A supplied with a signal $LO^+$ and a transistor 111B supplied with a signal $LO^-$. The signal $LO^-$ is an inverted signal of the signal $LO^+$. The signal $LO^+$ is sometimes referred to as the signal LO. The transistors 111A and 111B are OS transistors. The voltage-to-current conversion portion 103 includes a transistor 121A supplied with the signal $V_{RF}$. The transistor 121A is a GaN transistor.

The semiconductor device 100 outputs the signal $V_{IF}$ in accordance with the frequencies of the signal $V_{RF}$ and the signal LO. As to the frequency of the signal $V_{IF}$, when the frequency of the signal $V_{RF}$ is denoted by f1 and the frequency of the signal LO is denoted by f2, a signal with a frequency of (f1−f2) or (f1+f2) can be generated. Note that since the GaN transistor has higher field-effect mobility than the OS transistor, the frequency f1 is preferably higher than the frequency f2. With this structure, a frequency band that can be input can be widened.

The transistor 111A and the transistor 111B, and the transistor 121A illustrated in FIG. 2A can be provided to be stacked in different layers over a substrate. FIG. 2B is a diagram schematically illustrating layers including the transistors stacked over the substrate in the semiconductor device 100 according to one embodiment of the present invention.

The schematic diagram of the semiconductor device 100 illustrated in FIG. 2B illustrates a substrate 140, a layer 141 including the transistor 121 (the transistor 121A), and a layer 142 including the transistors 111 (the transistors 111A and 111B). The layer 142 including the transistors 111 is provided in a layer above the layer 141 including the transistor 121. That is, the transistor 111 can be provided in a layer above the layer provided with the transistor 121. The circuit area where the OS transistors can be arranged is increased, so that the amount of current flowing through the transistor in the current switch portion 102 can be increased.

Note that a substrate containing silicon, such as a SIMOX (Separation by Implanted Oxygen) substrate or an SOI substrate, can be used as the substrate 140. Such a substrate is suitable because a transistor containing silicon in a channel formation region (a Si transistor) can be provided in the substrate or over the substrate.

A structure is employed in which the signal LO and the signal $V_{RF}$ that are supplied to the current switch portion 102 and the voltage-to-current conversion portion 103 illustrated in FIG. 1, respectively, are output from control portions. This structure is described with reference to FIG. 3A and FIG. 3B.

Figures 3A, 3B:
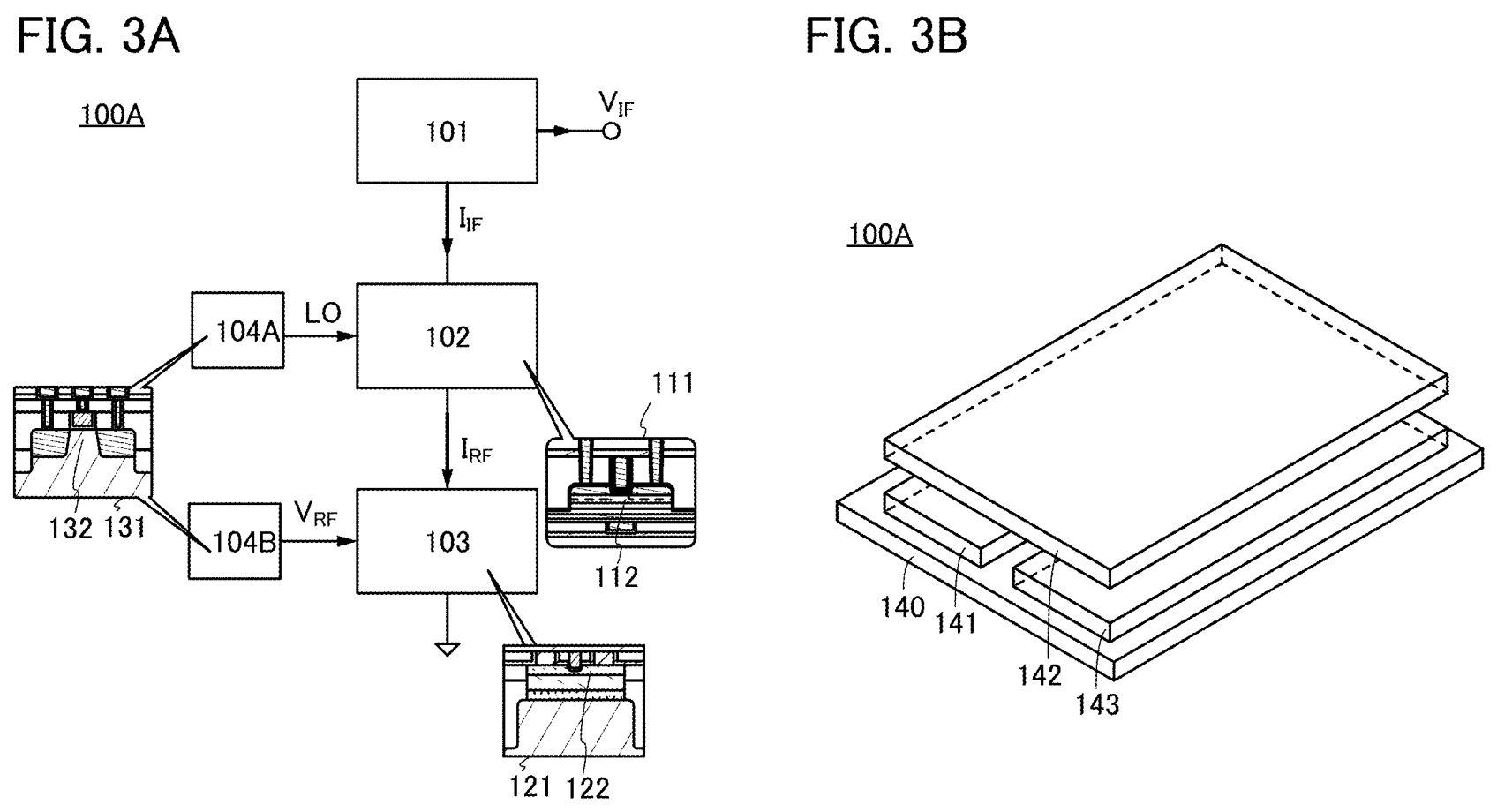

A semiconductor device 100A illustrated in FIG. 3A corresponds to a structure including a control portion 104A and a control portion 104B in addition to the structure illustrated in FIG. 1. The control portion 104A and the control portion 104B each have a function of a signal output portion of an oscillation circuit or the like.

The control portion 104A and the control portion 104B each include a transistor 131 that functions as a bias generation circuit capable of generating bias voltage or an oscillation circuit. It is preferable that the transistor 131 be a transistor that can form a bias generation circuit or an oscillation circuit. For example, a transistor in which a semiconductor layer 132 including a channel formation region is silicon (a Si transistor) is suitable. A Si transistor can form a complementary circuit structure using an n-channel transistor and a p-channel transistor; thus, the Si transistor is suitable when the circuit functions as a logic circuit or an oscillation circuit. Note that each of the control portion 104A and the control portion 104B is sometimes referred to as a control circuit or simply referred to as a circuit.

Note that the transistors 131 that are the Si transistors can be provided to be stacked in different layers over the substrate. FIG. 3B is a diagram schematically illustrating layers including the transistors stacked over the substrate in the semiconductor device 100A according to one embodiment of the present invention.

The schematic diagram of the semiconductor device 100A illustrated in FIG. 3B illustrates a layer 143 including the transistor 131 in addition to the substrate 140, the layer 141, and the layer 142 that are illustrated in FIG. 2B. The layer 142 is provided in a layer above the layer 141 and the layer 143. That is, the transistor 111 can be provided in a layer above the layers provided with the transistor 121 and the transistor 131. The circuit area where the OS transistors can be arranged is increased, so that the amount of current flowing through the transistor in the current switch portion 102 can be increased.

Figures 4A, 4B:
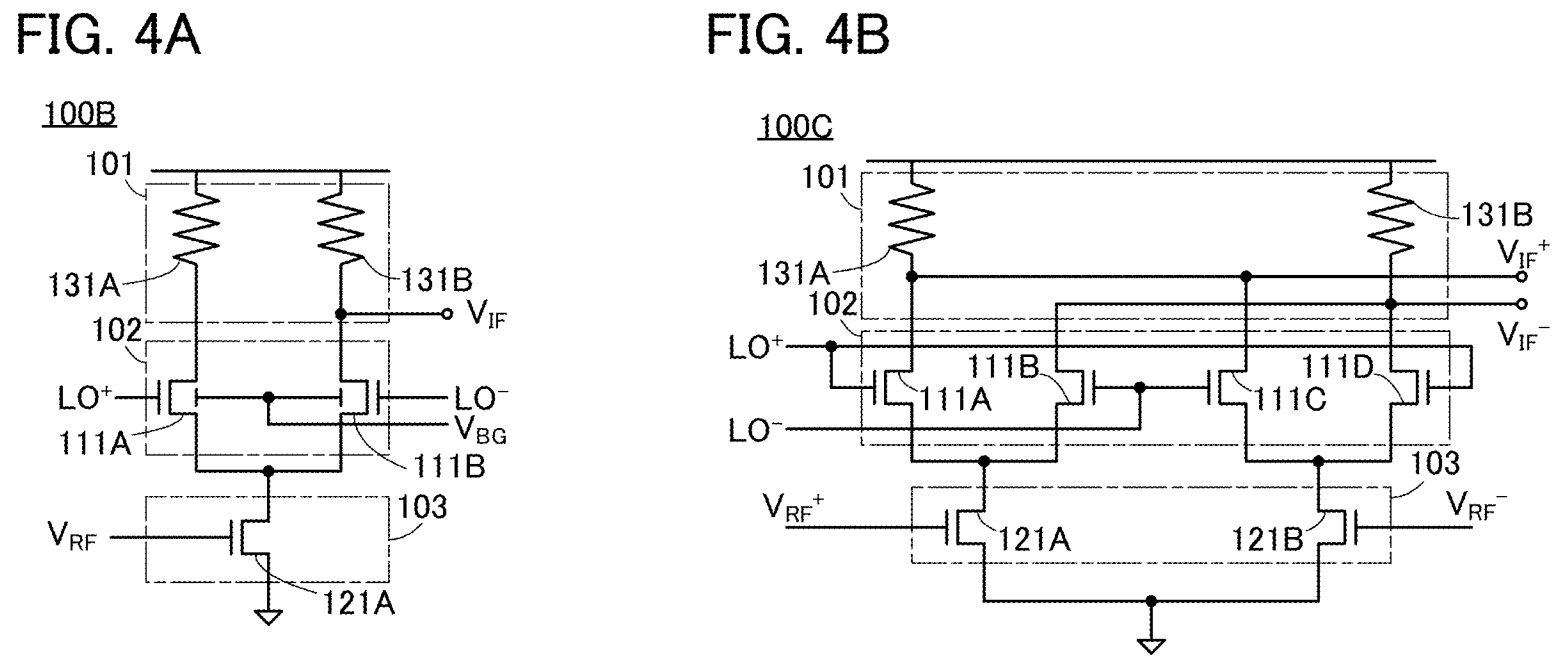

FIG. 4A is a diagram for illustrating a specific structure example of a modification example of the semiconductor device 100 described in FIG. 2A. As described in FIG. 1, a semiconductor device 100B illustrated in FIG. 4A includes the current-to-voltage conversion portion 101, the current switch portion 102, and the voltage-to-current conversion portion 103.

The transistor 111A and the transistor 111B in the current switch portion 102 illustrated in FIG. 4A each have a back gate electrode. In addition, back gate voltage $V_{BG}$ is applied to the back gate electrode. Electrical characteristics such as the threshold voltage of each of the transistor 111A and the transistor 111B that are the OS transistors can be controlled by the back gate voltage $V_{BG}$. Therefore, the transistors can operate while changing transistor electrical characteristics such as normally-off and normally-on characteristics. Note that a structure may be employed in which the back gate electrode of the OS transistor is connected to a gate electrode. With this structure, the amount of current flowing when the transistor is in an on state can be increased.

FIG. 4B is a diagram for illustrating a specific structure example of another modification example of the semiconductor device 100 described in FIG. 2A. As described in FIG. 1, a semiconductor device 100C illustrated in FIG. 4B includes the current-to-voltage conversion portion 101, the current switch portion 102, and the voltage-to-current conversion portion 103. A mixer circuit illustrated in FIG. 4B corresponds to a double balance mixer circuit that is different from a single balance mixer circuit described in FIG. 2A.

The current-to-voltage conversion portion 101 includes the resistor 131A and the resistor 131B. The current-to-voltage conversion portion 101 outputs signals $V_{IF}^{+}$ and $V_{IF}^{-}$. The signal $V_{IF}^{-}$ is an inverted signal of the signal $V_{IF}^{+}$. The signal $V_{IF}^{+}$ is sometimes referred to as the signal $V_{IF}$.

The current switch portion 102 includes the transistor 111A and a transistor 111D that are each supplied with the signal $LO^{+}$ and the transistor 111B and a transistor 111C that are each supplied with the signal $LO^{-}$. The transistors 111A to 111D are OS transistors. The voltage-to-current conversion portion 103 includes the transistor 121A supplied with a signal $V_{RF}^{+}$ and a transistor 121B supplied with a signal $V_{RF}^{-}$. The transistors 121A and 121B are GaN transistors. The signal $V_{RF}^{-}$ is an inverted signal of the signal $V_{RF}^{+}$. The signal $V_{RF}^{+}$ is sometimes referred to as the signal $V_{RF}$.

The semiconductor device 100C outputs the signal $V_{IF}$ in accordance with the frequencies of the signal $V_{RF}$ and the signal LO. As to the frequency of the signal $V_{IF}$, when the frequency of the signal $V_{RF}$ is denoted by f1 and the frequency of the signal LO is denoted by f2, the signals $V_{IF}^{+}$ and $V_{IF}$ each with the frequency of (f1−f2) or (f1+f2) can be generated.

Figure 5A:
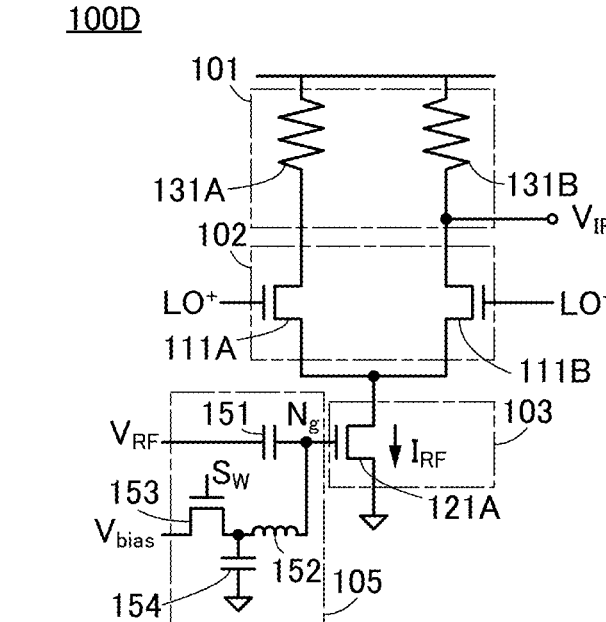
FIG. 5A and FIG. 5B are diagrams illustrating structure examples of a semiconductor device.

FIG. 5A is a diagram for illustrating a specific structure example of another modification example of the semiconductor device 100 described in FIG. 2A. A semiconductor device 100D illustrated in FIG. 5A includes a bias voltage retention portion 105 in addition to the current-to-voltage conversion portion 101, the current switch portion 102, and the voltage-to-current conversion portion 103 that are described in FIG. 1.

The bias voltage retention portion 105 has a function of retaining bias voltage for operating the voltage-to-current conversion portion 103. When the bias voltage retention portion 105 retains bias voltage, the voltage-to-current conversion portion 103 allows the current $I_{RF}$ to flow easily in accordance with the input signal $V_{RF}$. Note that the bias voltage retention portion 105 is sometimes referred to as a bias voltage retention circuit or simply referred to as a circuit or a retention circuit.

The bias voltage retention portion 105 includes a capacitor 151, an inductor 152, a transistor 153, and a capacitor 154. The transistor 153 applies bias voltage $V_{bias}$ to a node $N_g$ that serves as a gate of the transistor 121A through the inductor 152 by control of a control signal $S_W$. The off-state current of the transistor 153 can be made extremely low when the transistor 153 is an OS transistor. Therefore, by setting the transistor 153 in an off state, the bias voltage retention portion 105 can continue to retain the bias voltage $V_{bias}$ applied to the node $N_g$.

Figure 5B:
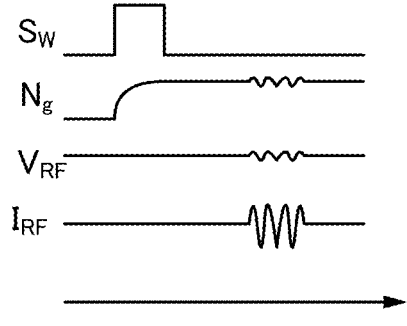

In addition, FIG. 5B illustrates a timing chart for showing the operation of the bias voltage retention portion 105 in FIG. 5A. As shown in FIG. 5B, the control signal $S_W$ is set at an H level so that the transistor 153 that functions as a switch is set in an on state. The bias voltage $V_{bias}$ is applied to the node $N_g$. By setting the transistor 153 in an off state, the bias voltage $V_{bias}$ is retained in the node $N_g$. When the signal $V_{RF}$ is supplied to one electrode of the capacitor 151, the bias voltage $V_{bias}$ in the node $N_g$ fluctuates following a change in the signal $V_{RF}$. Owing to this potential fluctuation, the current $I_{RF}$ flowing through the transistor 121A can be increased.

Figure 6A:
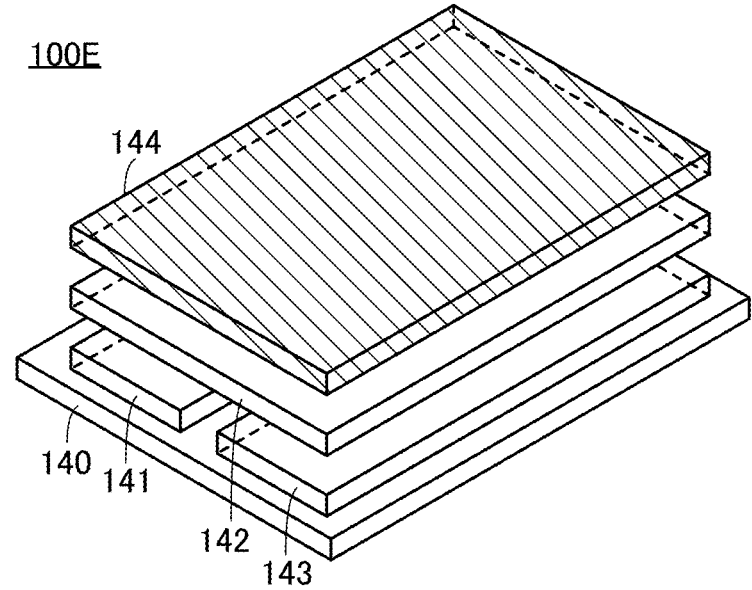
FIG. 6A and FIG. 6B are diagrams illustrating structure examples of a semiconductor device.
Figure 6B:
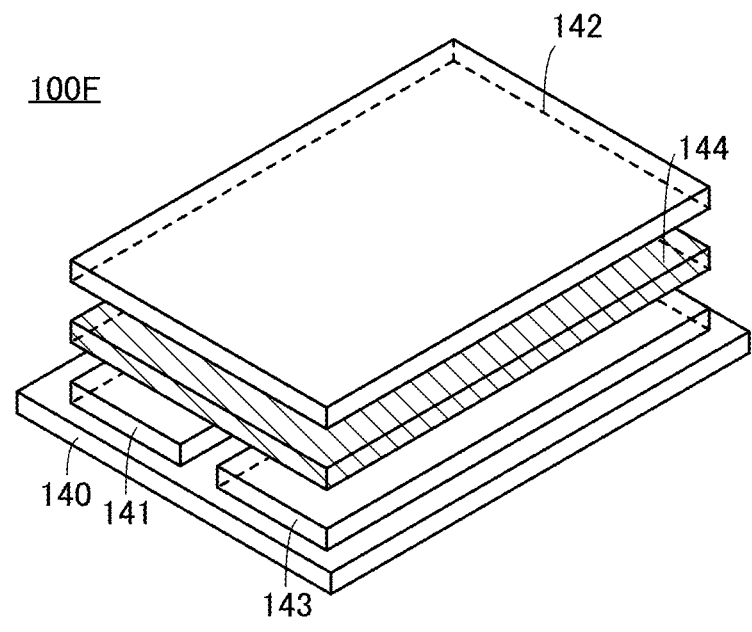

The inductor 152 illustrated in FIG. 5A can be provided to be stacked in different layers over a substrate by processing a conductor into a predetermined shape. FIG. 6A and FIG. 6B are diagrams each schematically illustrating the layers including the transistors stacked over the substrate and the layer including the inductor in the semiconductor device 100 according to one embodiment of the present invention.

A schematic diagram of a semiconductor device 100E illustrated in FIG. 6A includes a layer 144 including the inductor 152 in addition to the substrate 140, the layer 141, the layer 142, and the layer 143 that are illustrated in FIG. 3B. The layer 144 is provided in a layer above the layer 142. That is, the layer 144 including the inductor 152 can be provided in a layer above the layers including the transistors. Alternatively, like a semiconductor device 100F illustrated in FIG. 6B, the layer 144 can be provided between the layers including the transistors. Note that as the inductor, for example, a conductor of approximately 2 μm thickness is formed. With the structure of the semiconductor device 100E or 100F, a structure including the bias voltage retention portion 105 can be formed over the substrate.

Figure 7A:
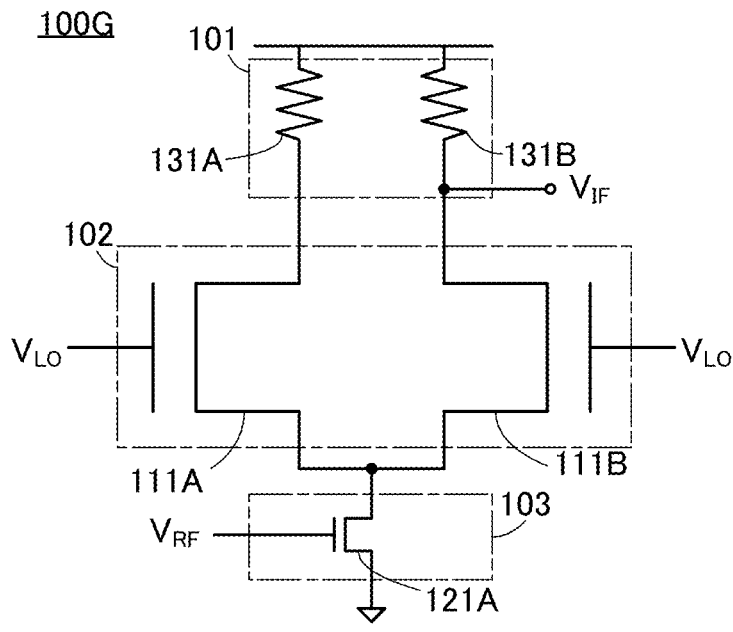
FIG. 7A and FIG. 7B are diagrams illustrating structure examples of a semiconductor device.

FIG. 7A is a diagram for illustrating a specific structure example of another modification example of the semiconductor device 100 described in FIG. 2A. FIG. 7A schematically illustrates a semiconductor device 100G in which the transistor size of each of the transistor 111A and the transistor 111B in the current switch portion 102 is larger than that of the transistor 121A in the voltage-to-current conversion portion 103.

Note that when the transistor size of each of the transistor 111A and the transistor 111B in the current switch portion 102 is larger than the transistor size of the transistor 121A in the voltage-to-current conversion portion 103, switch operation can be performed without limitation on the amount of current that is determined by the transistor in the voltage-to-current conversion portion 103. The amount of current in the OS transistor is smaller than the amount of current in a GaN transistor with the same transistor size. Therefore, the channel length of the OS transistor is preferably shorter than the channel length of the GaN transistor. In addition, the channel width of the OS transistor is preferably greater than the channel width of the GaN transistor. With this structure, the amount of current flowing through the current switch portion 102 can be made closer to the amount of current flowing through the voltage-to-current conversion portion 103.

Figure 7B:
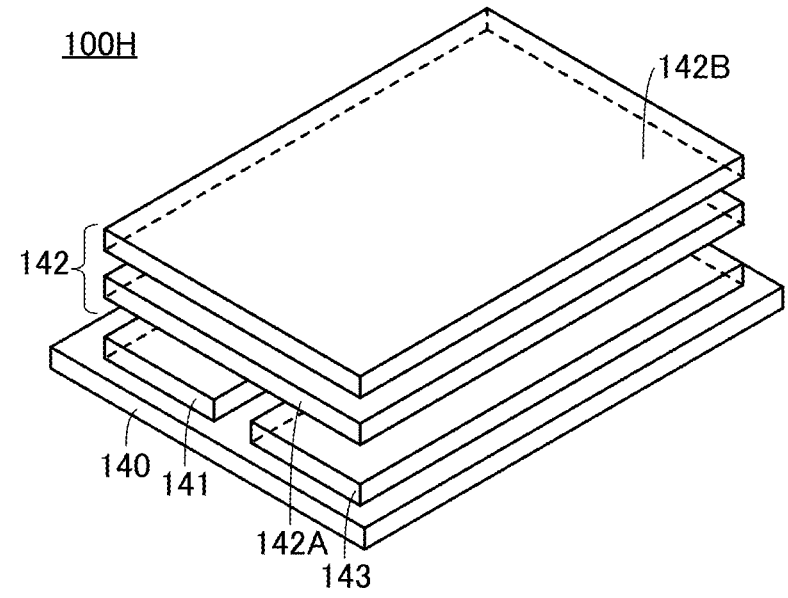

Note that in the case where the transistor size of each of the transistor 111A and the transistor 111B that are the OS transistors in the current switch portion 102 is large, the circuit area where the OS transistors can be arranged is preferably large. For example, when a structure is employed in which a plurality of layers 142A and 142B are stacked as the layer 142 that is the layer including the OS transistor, as illustrated in a schematic diagram of the semiconductor device 100H illustrated in FIG. 7B, the circuit area where the OS transistors can be arranged can be increased.

In addition, FIG. 8A to FIG. 8C are diagrams each illustrating a specific structure example of a stacked-layer structure of the semiconductor device 100A or the like described in FIG. 3B and the like. Block diagrams illustrated in FIG. 8A to FIG. 8C each schematically show arrangement or the like of each component (the layer 141, the layer 142, and the layer 143) over the substrate 140 described in FIG. 3B and the like.

FIG. 8A illustrates a buffer layer 145 including the transistor 131 that is the GaN transistor and provided between the layer 141 and the substrate 140 in addition to the layer 141, the layer 142, and the layer 143 that are provided over the substrate 140. The buffer layer 145 is provided so that different kinds of semiconductor layers using a nitride semiconductor such as GaN are formed over the substrate 140. With the structure in FIG. 8A, a structure can be employed in which the layer 141 including the transistor 121 and the layer 143 including the transistor 131 are provided over the substrate 140 and the layer 142 including the transistor 111 is sequentially stacked thereover.

FIG. 8B illustrates a structure example where the substrate 140 provided with the layer 141 over the buffer layer 145 is attached to a substrate 146 that is provided with a stack of the layer 143 including the transistor 131 and the layer 142 including the transistor 111 so that the respective transistors are electrically connected and a semiconductor device is obtained. Since the transistor 121 included in the layer 141 is the Si transistor, a substrate including silicon, such as a SIMOX substrate or an SOI substrate, can be used as the substrate 146. Note that as a technique of attaching substrates, a plasma activated bonding technique or a technique of bonding substrates with Cu—Cu bonding or the like can be used, for example.

FIG. 8C illustrates a structure example where the substrate 140 provided with the layer 143 and the layer 141 over the buffer layer 145 is attached to a substrate 147 that is provided with a stack of the layer 142 including the transistor 111 so that the respective transistors are electrically connected and a semiconductor device is obtained. Since the transistor 121 included in the layer 142 is the OS transistor, a glass substrate or the like can be used as the substrate 147 instead of a silicon substrate.

According to one embodiment of the present invention, in a semiconductor device that functions as an active mixer including a current-to-voltage conversion portion, a current switch portion, and a voltage-to-current conversion portion, a transistor in the current switch portion is an OS transistor and a transistor in the voltage-to-current conversion portion is a GaN transistor. Thus, a change in off-state current due to fluctuation in transistor characteristics can be decreased, and a semiconductor device or the like that is excellent in reducing power consumption can be provided. Alternatively, even in the case of a high-temperature environment where transistor characteristics easily fluctuate, a semiconductor device or the like with high operational reliability can be provided. Alternatively, a layer including an OS transistor can be provided to be stacked over transistors including different kinds of semiconductor layers, such as a GaN transistor and a Si transistor; thus, a smaller semiconductor device or the like can be provided.

Embodiment 2

Figure 9:
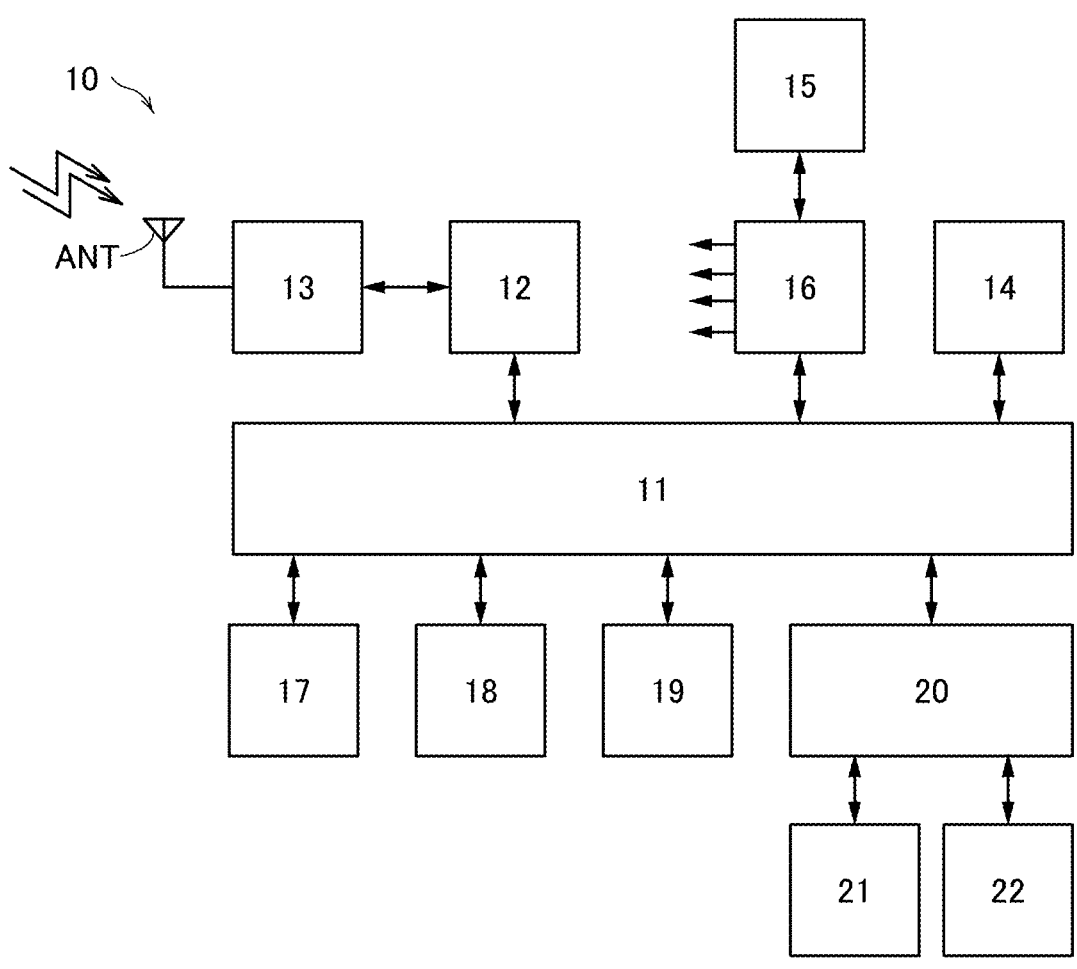
FIG. 9 is a diagram for illustrating a structure example of a wireless communication device.
Figure 10:
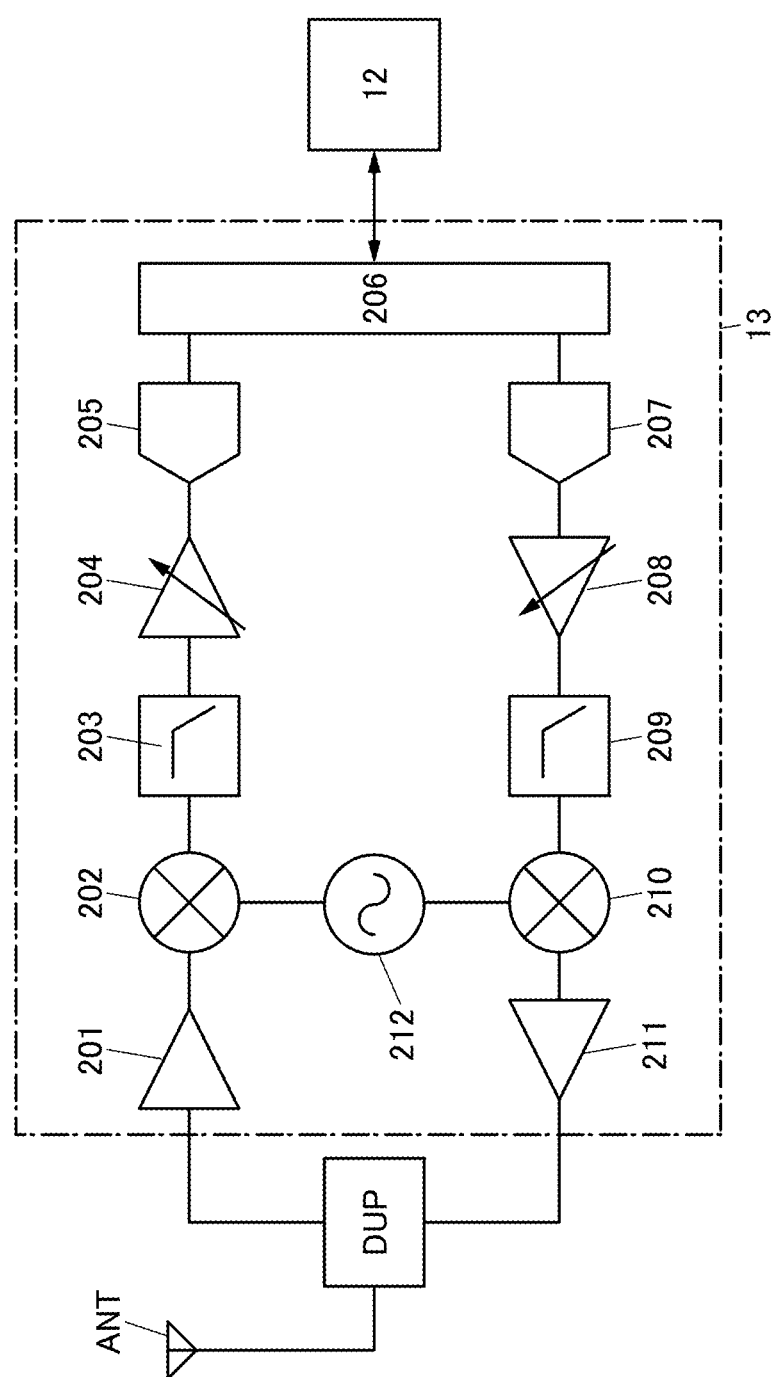
FIG. 10 is a diagram for illustrating a structure example of a wireless communication device.

In this embodiment, a structure example of a wireless communication device including an integrated circuit including the semiconductor device 100 described in the above embodiment is described using FIG. 9 and FIG. 10. Note that although a smartphone is described as an example of the wireless communication device in this embodiment, other wireless communication terminals such as a portable game console, a tablet PC (Personal Computer), and a laptop PC may be used. In addition, the wireless communication device according to this embodiment can be applied to a device capable of performing wireless communication.

A wireless communication device 10 in a block diagram illustrated in FIG. 9 includes an antenna ANT, an application processor 11, a baseband processor 12, an integrated circuit 13 (IC), a memory 14, a battery 15, a power management IC (PMIC) 16, a display portion 17, a camera portion 18, an operation input portion 19, an audio IC 20, a microphone 21, and a speaker 22. Note that the integrated circuit 13 is also referred to as an RF (Radio Freqency) IC, a wireless chip, or the like.

A plurality of antennas ANT for a plurality of frequency bands are provided to be compatible with the 5G communication standard.

The application processor 11 has a function of performing processing for fulfilling various functions of the wireless communication device 10 by reading a program stored in the memory 14. For example, the application processor 11 has a function of executing an OS (Operating System) program from the memory 14 and executing an application program with this OS program as an operating platform.

The baseband processor 12 has a function of performing baseband processing including encoding (e.g., error correction encoding) processing, decoding processing, or the like on data that is transmitted and received by the wireless communication device 10. Specifically, the baseband processor 12 has a function of receiving transmission data from the application processor 11, performing encoding processing on the received transmission data, and transmitting the data to the integrated circuit 13. In addition, the baseband processor 12 has a function of receiving reception data from the integrated circuit 13, performing decoding processing on the received reception data, and transmitting the data to the application processor 11.

The integrated circuit 13 has a function of performing modulation processing or demodulation processing on data that is transmitted and received by the wireless communication device 10. Specifically, the integrated circuit 13 has a function of generating a transmission signal by performing modulation processing using a carrier wave on the transmission data received from the baseband processor 12 and outputting the transmission signal via the antenna ANT. In addition, the integrated circuit 13 has a function of receiving a reception signal via the antenna ANT, generating reception data by performing demodulation processing using a carrier wave on the reception signal, and transmitting the reception data to the baseband processor 12.

The memory 14 has a function of storing a program and data used by the application processor 11. Note that the memory 14 includes a nonvolatile memory that retains stored data even when power supply is interrupted and a volatile memory that loses stored data when power supply is interrupted.

The battery 15 is used when the wireless communication device 10 operates without an external power supply device. Note that the wireless communication device 10 can use power supply from the battery 15 also in the case where an external power supply is connected. In addition, a secondary battery capable of charging and discharging is preferably used as the battery 15.

The power management IC 16 has a function of generating internal power supply voltage from the battery 15 or the external power supply. The internal power supply voltage is applied to each of the blocks in the wireless communication device 10. At this time, the power management IC 16 has a function of controlling internal power supply voltage for each block to which the internal power supply voltage is supplied. The power management IC 16 controls the internal power supply voltage on the basis of an instruction from the application processor 11. In addition, the power management IC 16 can control supply and interrupt of supply of the internal power supply voltage block by block. Furthermore, the power management IC 16 also has a function of controlling charging to the battery 15 in the case where supply from the external power supply device is obtained.

The display portion 17 is a liquid crystal display device or a light-emitting display device and has a function of displaying various images in response to processing in the application processor 11. Images to be displayed on the display portion 17 include a user interface image with which a user gives an operation instruction to the wireless communication device 10, a camera image, a moving image, and the like.

The camera portion 18 has a function of acquiring an image in accordance with the instruction from the application processor 11. The operation input portion 19 has a function of a user interface that a user operates to give an operation instruction to the wireless communication device 10. The audio IC 20 has a function of driving the speaker 22 by decoding audio data transmitted from the application processor 11. In addition, the audio IC 20 has a function of generating audio data by encoding audio data obtained by the microphone 21 and outputting the audio data to the application processor 11.

FIG. 10 is a block diagram illustrating a structure example of the integrated circuit 13. The integrated circuit 13 illustrated in FIG. 10 includes a low noise amplifier 201, a mixer 202, a low-pass filter 203, a variable gain amplifier 204, an analog-to-digital converter circuit 205, an interface portion 206, a digital-to-analog converter circuit 207, a variable gain amplifier 208, a low-pass filter 209, a mixer 210, a power amplifier 211, and an oscillation circuit 212. In addition, FIG. 10 also illustrates the antenna ANT, a duplexer DUP, and the baseband processor 12. Note that the low noise amplifier 201, the mixer 202, the low-pass filter 203, the variable gain amplifier 204, and the analog-to-digital converter circuit 205 are referred to as a receiving circuit block, and the digital-to-analog converter circuit 207, the variable gain amplifier 208, the low-pass filter 209, the mixer 210, and the power amplifier 211 are referred to as a transmitting circuit block in some cases.

Note that the baseband processor 12 and the integrated circuit 13 are formed of separate semiconductor chips. Note that the duplexer DUP includes an antenna switch and the like.

The low noise amplifier 201 amplifies a signal received by the antenna ANT with low noise. The mixer 202 corresponds to a structure including the semiconductor device 100 described in Embodiment 1. The mixer 202 performs demodulation and down conversion (frequency conversion) using a signal of the oscillation circuit 212. The low-pass filter 203 removes an unnecessary high-frequency component from a signal from the mixer 202. The variable gain amplifier 204 amplifies an output signal from the low-pass filter 203 with a gain taking the input range of the analog-to-digital converter circuit 205 into account. The analog-to-digital converter circuit 205 converts the analog signal from the variable gain amplifier 204 into a digital signal. The digital signal is output to the baseband processor 12 via the interface portion 206.

The digital-to-analog converter circuit 207 converts the digital signal received by the interface portion 206 into an analog signal. The variable gain amplifier 208 amplifies an output signal from the digital-to-analog converter circuit 207. The low-pass filter 209 removes an unnecessary high-frequency component from a signal from the variable gain amplifier 208. The mixer 210 corresponds to a structure including the semiconductor device 100 described in Embodiment 1. The mixer 210 performs modulation and upconversion (frequency conversion) using a signal of the oscillation circuit 212. The power amplifier 211 amplifies an output signal from the mixer 210 with a predetermined gain and outputs the signal.

The composition, structure, method, and the like described in this embodiment can be used in combination as appropriate with the compositions, structures, methods, and the like described in the other embodiments and the like.

Embodiment 3

In this embodiment, structures of transistors that can be used in the semiconductor device described in the above embodiment will be described. For example, a structure in which transistors having different electrical characteristics are provided to be stacked will be described. With such a structure, the degree of freedom in design of a semiconductor device can be increased. In addition, providing transistors having different electrical characteristics to be stacked can increase the integration degree of the semiconductor device.

Figure 11:
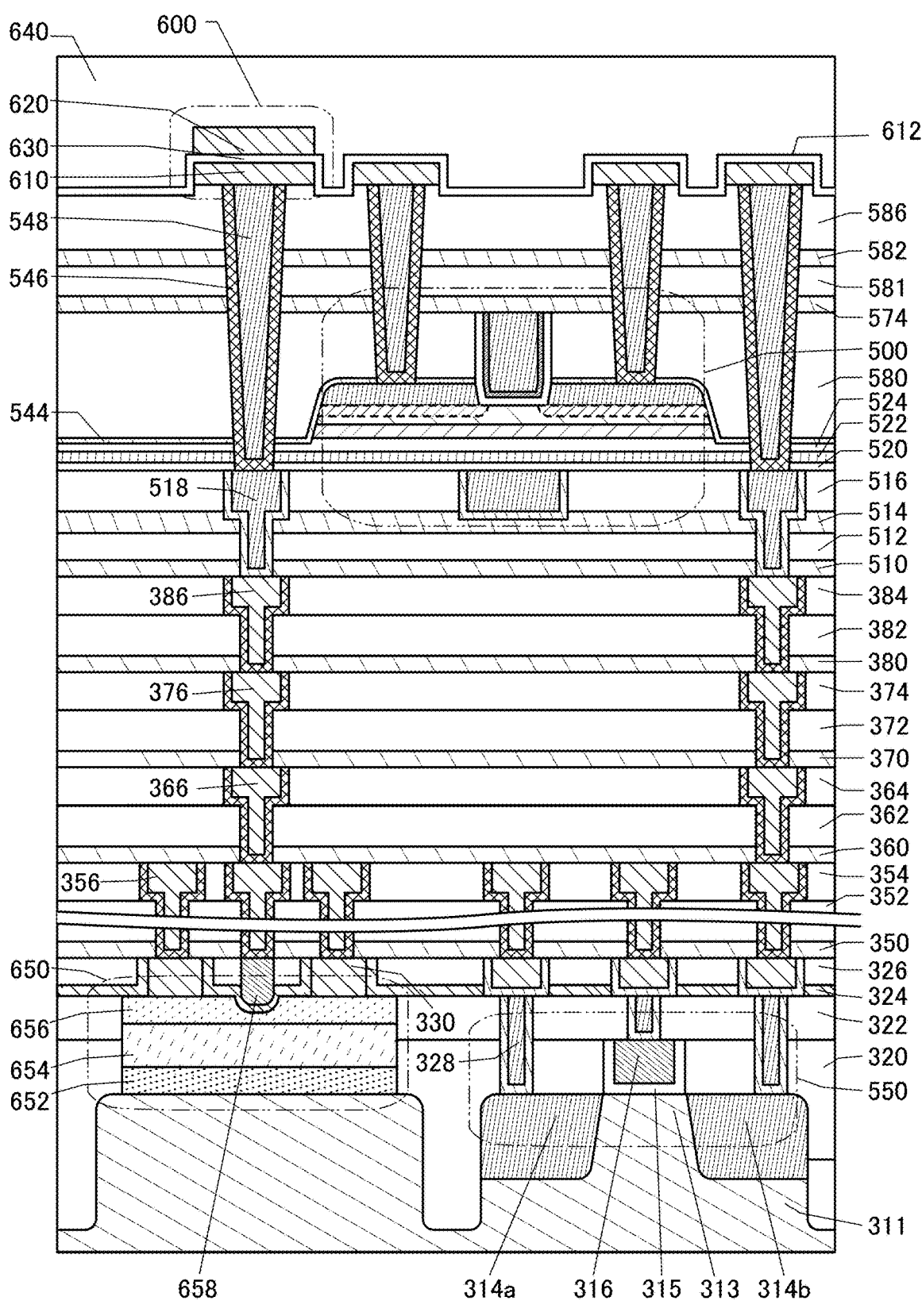
FIG. 11 is a diagram illustrating a structure example of a semiconductor device.
Figure 12A:
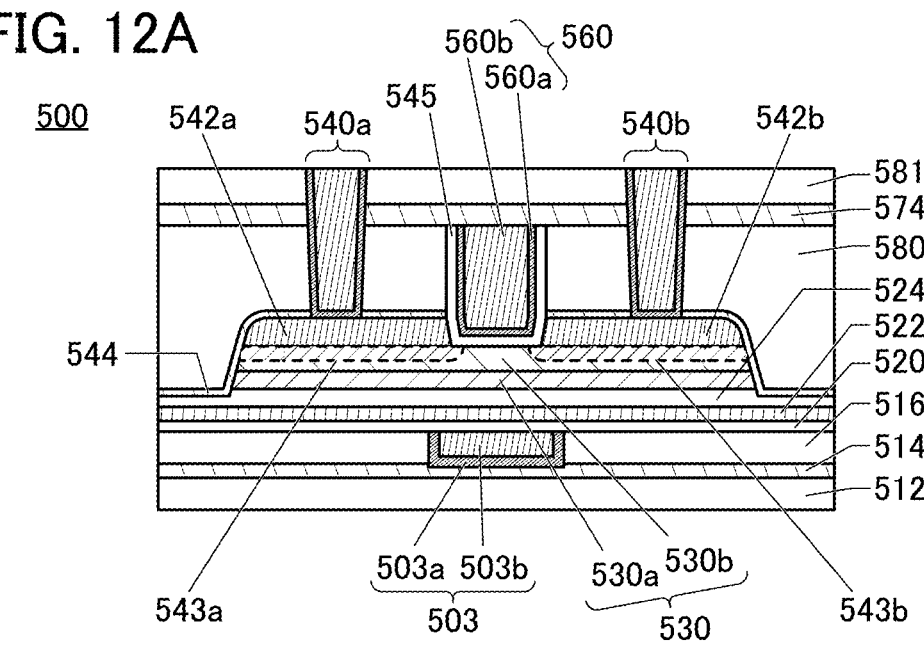
FIG. 12A to FIG. 12C are diagrams illustrating a structure example of a transistor.
Figure 12B:
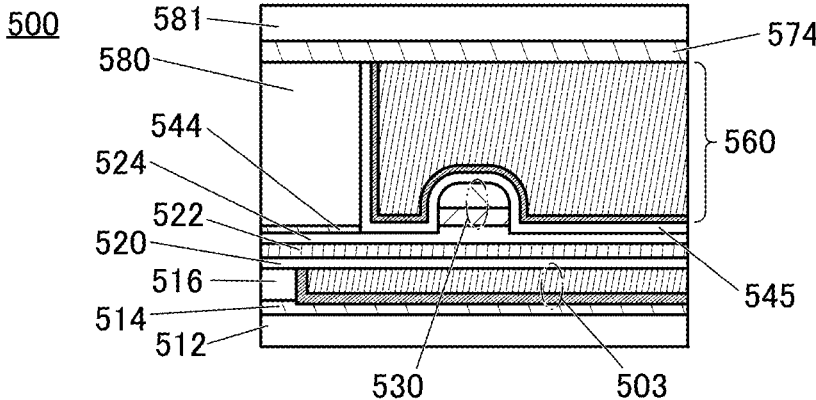
Figure 12C:
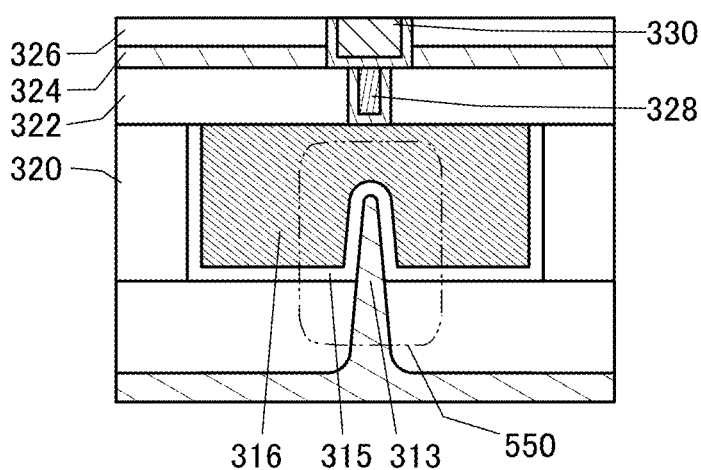

FIG. 11 illustrates part of a cross-sectional structure of a semiconductor device. The semiconductor device illustrated in FIG. 11 includes a transistor 550, a transistor 500, a transistor 650, and a capacitor 600. FIG. 12A is a cross-sectional view of the transistor 500 in a channel length direction, FIG. 12B is a cross-sectional view of the transistor 500 in a channel width direction, and FIG. 12C is a cross-sectional view of the transistor 550 in a channel width direction. For example, the transistor 500 corresponds to the transistor 111 described in the above embodiment, the transistor 550 corresponds to the transistor 131, and the transistor 650 corresponds to the transistor 121. Furthermore, the capacitor 600 corresponds to the capacitor 151.

The transistor 500 is an OS transistor. In FIG. 11, the transistor 500 is provided above the transistor 550 and the transistor 650, and the capacitor 600 is provided above the transistor 550 the transistor 650, and the transistor 500.

The transistor 550 is provided on a substrate 311 and includes a conductor 316, an insulator 315, a semiconductor region 313 that is part of the substrate 311, and a low-resistance region 314a and a low-resistance region 314b each functioning as a source region or a drain region.

As illustrated in FIG. 12C, in the transistor 550, a top surface and a side surface in the channel width direction of the semiconductor region 313 are covered with the conductor 316 with the insulator 315 therebetween. The use of such a Fin-type transistor as the transistor 550 can increase the effective channel width and thus improve on-state characteristics of the transistor 550. In addition, contribution of the electric field of a gate electrode can be increased, so that the off-state characteristics of the transistor 550 can be improved.

Note that the transistor 550 may be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure using silicon whose effective mass is controlled by applying stress to a crystal lattice and changing lattice spacing may be employed. Alternatively, the transistor 550 may be a HEMT (High Electron Mobility Transistor) using GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

For the conductor 316 functioning as a gate electrode, a semiconductor material such as silicon containing the element that imparts n-type conductivity, such as arsenic or phosphorus, or the element that imparts p-type conductivity, such as boron, or a conductive material such as a metal material, an alloy material, or a metal oxide material can be used.

Note that since a work function depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (silicon on Insulator) substrate or the like.

In addition, as the SOI substrate, the following substrate may be used: a SIMOX (Separation by Implanted Oxygen) substrate that is formed in such a manner that after an oxygen ion is implanted into a mirror-polished wafer, an oxide layer is formed at a certain depth from a surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by heat treatment; an ELTRAN method (a registered trademark: Epitaxial Layer Transfer); or the like. A transistor formed using a single crystal substrate contains a single crystal semiconductor in a channel formation region.

The transistor 650 is described here. The transistor 650 is formed over the same substrate where the transistor 550 is formed. The transistor 650 is formed using a semiconductor layer to be formed over a single crystal silicon substrate, a sapphire substrate, or an SOI substrate. The transistor 650 is a nitride semiconductor containing gallium in a channel formation region. The semiconductor layer preferably has a crystalline structure containing gallium. Examples of the semiconductor layer containing gallium include gallium nitride (hereinafter, GaN).

A semiconductor device using GaN for a semiconductor layer 654 is described using FIG. 11. For example, GaN can be formed in such a manner that a buffer layer 652 is provided over the substrate 311 to make single crystal GaN epitaxially grow on the buffer layer 652. The single crystal GaN formed by epitaxial growth corresponds to the semiconductor layer 654. Note that FIG. 11 illustrates the example where a single crystal silicon substrate is used as the substrate 311.

When the transistor 650 is formed, a semiconductor layer where a semiconductor layer 656 is epitaxially grown on the semiconductor layer 654 is preferably used. In the case where the semiconductor layer 654 is GaN, the semiconductor layer 656 is preferably AlGaN. For example, aluminum nitride (AlN) is known to have excellent material characteristics such as a band gap (6.2 eV) approximately twice that of GaN, an electrostatic breakdown electric field (12 MV/cm) approximately four times that of GaN, and thermal conductivity (2.9 W/cmK) approximately 1.5 times that of GaN. Therefore, AlN and AlGaN, which is a mixed crystal of AlN and GaN, are preferable as materials for a high-output and high-frequency device. A HEMT (High Electron Mobility Transistor) whose channel formation region is AlGaN can operate with higher breakdown voltage than a HEMT whose channel formation region is GaN. Note that at an interface between GaN and AlGaN, two dimensional electron gas (2DEG) is generated due to polarization effects in GaN and AlGaN. That is, in a transistor with a HEMT structure, 2DEG is a channel formation region.

A conductor 330 is provided over the semiconductor layer 656. The conductor 330 corresponds to a source or a drain of the transistor 650.

An insulator 324 is provided between a conductor 658 and the semiconductor layer 656. Note that the conductor 658 may also be referred to as a gate electrode, and the insulator 324 may also be referred to as a gate insulator of the transistor 650. For the insulator 324, silicon oxide, aluminum oxide, hafnium oxide, or the like can be used. For example, when the insulator 324 contains any one of silicon oxide, aluminum oxide, and hafnium oxide, the off-state current of the transistor 650 is reduced. Furthermore, for detailed description of the gate insulator, the gate insulator is preferably a $SiO_2$ film, an $Al_2O_3$ film, or a $HfO_2$ film.

In addition, the transistor 650 preferably has a recessed gate structure. FIG. 11 illustrates an example in which the transistor 650 has a recessed gate structure. When the transistor 650 has a recessed gate structure, the off-state current of the transistor 650 can be reduced. The recessed gate structure is formed in such a manner that the semiconductor layer 656 that is in a position overlapping the gate electrode and in which a channel formation region is formed is etched to thin the semiconductor layer 656. The region of the semiconductor layer 656 that is thinned with the etching is referred to as a recessed region. The recessed region can have high threshold voltage due to increased depletion of 2DEG. In addition, large current can flow through a non-recessed region because the concentration of 2DEG is increased.

An insulator 320, an insulator 322, an insulator 324, and an insulator 326 are sequentially provided to be stacked to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, for example, silicon nitride formed by a CVD method can be suitably used. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 550. The film that inhibits hydrogen diffusion is specifically a film from which a small amount of hydrogen is released.

The amount of released hydrogen can be measured by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. In addition, the relative permittivity of the insulator 326 is, for example, preferably 0.7 times or less, further preferably 0.6 times or less the relative permittivity of the insulator 324. When a material with low permittivity is used for the interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Furthermore, the conductor 330 has a function of the source or the drain of the transistor 650. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 11, an insulator 350, an insulator 352, and an insulator 354 are sequentially provided to be stacked. Furthermore, a conductor 356 is formed in the insulator 350, the insulator 352, and the insulator 354. The conductor 356 has a function of a plug connected to the transistor 550, a plug connected to the transistor 650, or a wiring. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably includes a conductor having a barrier property against hydrogen. In particular, the conductor having a barrier property against hydrogen is formed in an opening portion of the insulator 350 having a barrier property against hydrogen. With this structure, the transistor 550 or the transistor 650 can be separated from the transistor 500 with a barrier layer, so that hydrogen diffusion from the transistor 550 or the transistor 650 into the transistor 500 can be inhibited.

Note that for the conductor having a barrier property against hydrogen, tantalum nitride or the like is preferably used, for example. In addition, by stacking tantalum nitride and tungsten, which has high conductivity, diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 11, an insulator 360, an insulator 362, and an insulator 364 are sequentially provided to be stacked. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably includes a conductor having a barrier property against hydrogen. In particular, the conductor having a barrier property against hydrogen is formed in an opening portion of the insulator 360 having a barrier property against hydrogen. With this structure, the transistor 550 or the transistor 650 can be separated from the transistor 500 with a barrier layer, so that hydrogen diffusion from the transistor 550 or the transistor 650 into the transistor 500 can be inhibited.

A wiring layer may be provided over the insulator 364 and the conductor 366. For example, in FIG. 11, an insulator 370, an insulator 372, and an insulator 374 are sequentially provided to be stacked. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably includes a conductor having a barrier property against hydrogen. In particular, the conductor having a barrier property against hydrogen is formed in an opening portion of the insulator 370 having a barrier property against hydrogen. With this structure, the transistor 550 or the transistor 650 can be separated from the transistor 500 with a barrier layer, so that hydrogen diffusion from the transistor 550 or the transistor 650 into the transistor 500 can be inhibited.

A wiring layer may be provided over the insulator 374 and the conductor 376. For example, in FIG. 11, an insulator 380, an insulator 382, and an insulator 384 are sequentially provided to be stacked. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably includes a conductor having a barrier property against hydrogen. In particular, the conductor having a barrier property against hydrogen is formed in an opening portion of the insulator 380 having a barrier property against hydrogen. With this structure, the transistor 550 or the transistor 650 can be separated from the transistor 500 with a barrier layer, so that hydrogen diffusion from the transistor 550 or the transistor 650 into the transistor 500 can be inhibited.

Although the wiring layer including the conductor 356, the wiring layer including the conductor 366, the wiring layer including the conductor 376, and the wiring layer including the conductor 386 are described above, the semiconductor device according to this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are sequentially provided to be stacked over the insulator 384. A substance having a barrier property against oxygen or hydrogen is preferably used for any of the insulator 510, the insulator 512, the insulator 514, and insulator 516.

For example, for each of the insulator 510 and the insulator 514, it is preferable to use a film having a barrier property that prevents diffusion of hydrogen or impurities from the substrate 311, a region where the transistor 550 is provided, a region where the transistor 650 is provided, or the like into a region where the transistor 500 is provided. Therefore, for each of the insulator 510 and the insulator 514, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550 or the transistor 650. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for each of the insulator 510 and the insulator 514, for example.

In particular, aluminum oxide has an excellent blocking effect that prevents passage of both oxygen and impurities such as hydrogen and moisture which are factors of fluctuation in electrical characteristics of the transistor. Accordingly, aluminum oxide can prevent mixing of impurities such as hydrogen and moisture into the transistor 500 during and after a manufacturing process of the transistor. In addition, release of oxygen from the oxide included in the transistor 500 can be inhibited. Therefore, aluminum oxide is suitably used for a protective film of the transistor 500.

In addition, for each of the insulator 512 and the insulator 516, a material similar to that for the insulator 320 can be used, for example. Furthermore, when a material with comparatively low permittivity is used for these insulators, parasitic capacitance generated between wirings can be reduced. A silicon oxide film, a silicon oxynitride film, or the like can be used for each of the insulator 512 and the insulator 516, for example.

Furthermore, a conductor 518, a conductor included in the transistor 500 (a conductor 503, for example), and the like are embedded in the insulator 510, the insulator 512, the insulator 514, and the insulator 516. Note that the conductor 518 has a function of a plug or a wiring that is connected to the capacitor 600, the transistor 550, or the transistor 650. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 or the transistor 650 can be separated from the transistor 500 with a layer having a barrier property against oxygen, hydrogen, and water, so that hydrogen diffusion from the transistor 550 or the transistor 650 into the transistor 500 can be inhibited.

The transistor 500 is provided above the insulator 516.

As illustrated in FIG. 12A and FIG. 12B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap a region between the conductor 542a and the conductor 542b; an insulator 545 positioned on a bottom surface and a side surface of the opening; and a conductor 560 positioned on a formation surface of the insulator 545.

In addition, as illustrated in FIG. 12A and FIG. 12B, an insulator 544 is preferably positioned between the insulator 580 and the oxide 530a, the oxide 530b, the conductor 542a, and the conductor 542b. Furthermore, as illustrated in FIG. 12A and FIG. 12B, the conductor 560 preferably includes a conductor 560a provided inside the insulator 545 and a conductor 560b provided to be embedded inside the conductor 560a. Moreover, as illustrated in FIG. 12A and FIG. 12B, an insulator 574 is preferably positioned over the insulator 580, the conductor 560, and the insulator 545.

Note that in this specification and the like, the oxide 530a and the oxide 530b are sometimes collectively referred to as an oxide 530. The conductor 542a and the conductor 542b are sometimes collectively referred to as the conductor 542.

Note that the transistor 500 is illustrated to have a structure in which two layers, the oxide 530a and the oxide 530b, are stacked in the region where the channel is formed and its vicinity; however, one embodiment of the present invention is not limited thereto. For example, a structure may be employed in which a single layer of the oxide 530b or a stacked-layer structure of three or more layers is provided.

In addition, although the conductor 560 has a stacked-layer structure of two layers in the transistor 500, one embodiment of the present invention is not limited thereto. For example, the conductor 560 may have a single-layer structure or a stacked-layer structure of three or more layers. Furthermore, the transistor 500 illustrated in FIG. 11 and FIG. 12A is an example and the structure is not limited thereto; an appropriate transistor is used in accordance with a circuit structure, a driving method, or the like.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region sandwiched between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, which results in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping the conductor 542a or the conductor 542b. Thus, parasitic capacitance formed between the conductor 560 and each of the conductor 542a and the conductor 542b can be reduced. As a result, the switching speed of the transistor 500 can be increased, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, by changing voltage applied to the conductor 503 not in synchronization with but independently of voltage applied to the conductor 560, the threshold voltage of the transistor 500 can be controlled. In particular, when negative voltage is applied to the conductor 503, the threshold voltage of the transistor 500 can be further increased, and the off-state current can be reduced. Thus, drain current at the time when voltage applied to the conductor 560 is 0 V can be lower in the case where negative voltage is applied to the conductor 503 than in the case where negative voltage is not applied to the conductor 503.

The conductor 503 is positioned to overlap the oxide 530 and the conductor 560. Thus, when voltage is applied to the conductor 560 and the conductor 503, an electric field generated from the conductor 560 and an electric field generated from the conductor 503 are connected, so that the channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. In addition, in this specification and the like, the S-channel structure has a feature in that the side surface and the vicinity of the oxide 530 in contact with the conductor 542a and the conductor 542b functioning as the source electrode and the drain electrode are of I-type like the channel formation region. Furthermore, the side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. Moreover, the S-channel structure disclosed in this specification and the like is different from a Fin-type structure and a planar structure. With the S-channel structure, resistance to a short-channel effect can be increased, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the conductor 503a and the conductor 503b are stacked in the transistor 500, one embodiment of the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 is illustrated to have a stacked layer of the conductor 503a and the conductor 503b in this embodiment, the conductor 503 may have a single-layer structure.

The insulator 520, the insulator 522, and the insulator 524 have a function of a second gate insulating film.

Here, an insulator containing oxygen more than that in the stoichiometric composition is preferably used as the insulator 524 in contact with the oxide 530. Such oxygen is easily released from the insulator by heating. In this specification and the like, oxygen released by heating is sometimes referred to as "excess oxygen." That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. Note that when hydrogen enters the oxygen vacancies in the oxide 530, such defects (hereinafter, referred to as $V_OH$ in some cases) serve as donors and generate electrons serving as carriers in some cases. In addition, in some cases, bonding of part of hydrogen to oxygen bonded to a metal atom generates electrons serving as carriers. Thus, a transistor using an oxide semiconductor that contains a large amount of hydrogen is likely to have normally-on characteristics. Moreover, hydrogen in an oxide semiconductor is easily transferred by stress such as heat or an electric field; thus, the reliability of the transistor might be reduced when the oxide semiconductor contains a large amount of hydrogen. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (this treatment is also referred to as "dehydration" or "dehydrogenation treatment") and to compensate for oxygen vacancies by supplying oxygen to the oxide semiconductor (this treatment is also referred to as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, stable electrical characteristics can be given.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of higher than or equal to 100° C. and lower than or equal to 700° C., or higher than or equal to 100° C. and lower than or equal to 400° C.

In addition, any one or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when reaction in which a bond of $V_OH$ is cut occurs, i.e., reaction of "$V_OH \rightarrow V_O + H$" occurs. Part of hydrogen generated at this time is bonded to oxygen and is removed as $H_2O$ from the oxide 530 or an insulator in the vicinity of the oxide 530 in some cases. In other cases, part of hydrogen is gettered by the conductor 542.

In addition, for the microwave treatment, for example, it is suitable to use an apparatus including a power supply that generates high-density plasma or an apparatus including a power supply that applies RF to a substrate side. For example, high-density oxygen radicals can be generated with the use of an oxygen-containing gas and high-density plasma, and by applying RF to the substrate side, the oxygen radicals generated by the high-density plasma can be efficiently introduced into the oxide 530 or the insulator in the vicinity of the oxide 530. Furthermore, pressure in the microwave treatment is higher than or equal to 133 Pa, preferably higher than or equal to 200 Pa, further preferably higher than or equal to 400 Pa. Moreover, as a gas introduced into an apparatus for performing the microwave treatment, for example, oxygen and argon are used and the oxygen flow rate ($O_2/(O_2 + Ar)$) is lower than or equal to 50%, preferably higher than or equal to 10% and lower than or equal to 30%.

In addition, in the manufacturing process of the transistor 500, it is suitable to perform the heat treatment with the surface of the oxide 530 exposed. The heat treatment is performed at higher than or equal to 100° C. and lower than or equal to 450° C., further preferably higher than or equal to 350° C. and lower than or equal to 400° C., for example. Note that the heat treatment is performed in a nitrogen gas or inert gas atmosphere, or an atmosphere containing an oxidizing gas at higher than or equal to 10 ppm, higher than or equal to 1%, or higher than or equal to 10%. For example, the heat treatment is preferably performed in an oxygen atmosphere. Accordingly, oxygen can be supplied to the oxide 530 to reduce oxygen vacancies ($V_O$). Alternatively, the heat treatment may be performed under reduced pressure. Alternatively, the heat treatment may be performed in such a manner that heat treatment is performed in a nitrogen gas or inert gas atmosphere, and then heat treatment is performed in an atmosphere containing an oxidizing gas at higher than or equal to 10 ppm, higher than or equal to 1%, or higher than or equal to 10% in order to compensate for released oxygen. Alternatively, the heat treatment may be performed in such a manner that heat treatment is performed in an atmosphere containing an oxidizing gas at higher than or equal to 10 ppm, higher than or equal to 1%, or higher than or equal to 10%, and then heat treatment is successively performed in a nitrogen gas or inert gas atmosphere.

Note that oxygen adding treatment performed on the oxide 530 can promote reaction in which oxygen vacancies in the oxide 530 are filled with supplied oxygen, i.e., reaction of "$V_O$+O→null." Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_O H$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, gate voltage during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used for the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and high relative permittivity.

Note that in the transistor 500 in FIG. 12A and FIG. 12B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is used as the oxide 530 including the channel formation region. Note that the oxide semiconductor preferably contains at least one of In and Zn. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor will be described in detail in another embodiment.

In addition, as the metal oxide functioning as the channel formation region in the oxide 530, a metal oxide whose band gap is greater than or equal to 2 eV, preferably greater than or equal to 2.5 eV is preferably used. The use of a metal oxide having such a wide band gap can reduce the off-state current of the transistor.

When the oxide 530 includes the oxide 530a under the oxide 530b, it is possible to inhibit diffusion of impurities into the oxide 530b from the components formed below the oxide 530a.

Note that the oxide 530 preferably has a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

In addition, the energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gradually changes at a junction portion of the oxide 530a and the oxide 530b. In other words, the energy level of the conduction band minimum at the junction portion of the oxide 530a and the oxide 530b continuously changes or is continuously connected. To change the energy level gradually, the density of defect states in a mixed layer formed at an interface between the oxide 530a and the oxide 530b is preferably made low.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 12A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 12A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulating film functioning as the gate insulating film has a stacked-layer structure of a high-k material and a thermally stable material, gate voltage during transistor operation can be reduced while the physical thickness is maintained. Furthermore, the stacked-layer structure can be thermally stable and have high relative permittivity.

Although the conductor 560 that functions as the first gate electrode and has a two-layer structure is illustrated in FIG. 12A and FIG. 12B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. Alternatively, for the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to those of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of fluctuation in electrical characteristics of the transistor. Accordingly, aluminum oxide can prevent mixing of impurities such as hydrogen and moisture into the transistor 500 during and after the manufacturing process of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with comparatively low permittivity is used for these insulators, parasitic capacitance between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

In addition, after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. Note that when an opening is formed to surround the transistor 500, for example, formation of an opening reaching the insulator 522 or the insulator 514 and formation of the insulator having a high barrier property to be in contact with the insulator 522 or the insulator 514 are suitable because these formation steps can also serve as some of the manufacturing steps of the transistor 500. Note that the insulator having a high barrier property against hydrogen or water is formed using a material similar to that for the insulator 522 or the insulator 514, for example.

Next, the capacitor 600 is provided above the transistor 650. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed in the same process.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to employ a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are illustrated in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In the case where the conductor 620 is formed in the same process as another component such as a conductor, copper (Cu), aluminum (Al), or the like, which is a low-resistance metal material, may be used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

As a substrate that can be used for the semiconductor device according to one embodiment of the present invention, a glass substrate, a quartz substrate, a sapphire substrate, a ceramic substrate, a metal substrate (e.g., a stainless steel substrate, a substrate including stainless steel foil, a tungsten substrate, a substrate including tungsten foil, or the like), a semiconductor substrate (e.g., a single crystal semiconductor substrate, a polycrystalline semiconductor substrate, a compound semiconductor substrate, or the like), an SOI (silicon on Insulator) substrate, or the like can be used. Alternatively, a plastic substrate having heat resistance to processing temperature in this embodiment may be used. Examples of the glass substrate include barium borosilicate glass, aluminosilicate glass, aluminoborosilicate glass, and soda lime glass. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, an aramid resin, an epoxy resin, an inorganic evaporated film, and paper. In particular, the use of a semiconductor substrate, a single crystal substrate, an SOI substrate, or the like for the manufacture of transistors enables the manufacture of small-sized transistors with a small variation in characteristics, size, shape, or the like and high current capability. When a circuit is formed with such transistors, lower power consumption of the circuit or higher integration of the circuit can be achieved.

Alternatively, a flexible substrate may be used as the substrate, and a transistor, a resistor, a capacitor, and/or the like may be formed directly on the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. Note that as the separation layer, a stacked-layer structure of a tungsten film and a silicon oxide film that are inorganic films, a structure in which an organic resin film of polyimide or the like is formed over a substrate, a silicon film containing hydrogen, or the like can be used, for example.

That is, a semiconductor device may be formed over one substrate and then transferred to another substrate. Examples of a substrate to which a semiconductor device is transferred include, in addition to the above substrates over which transistors can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), or the like), a leather substrate, and a rubber substrate. With the use of these substrates, the manufacture of a flexible semiconductor device, the manufacture of a robust semiconductor device, provision of high heat resistance, a reduction in weight, or a reduction in thickness can be achieved.

Providing a semiconductor device over a flexible substrate can suppress an increase in weight and can provide a robust semiconductor device.

Modification Example 1 of Transistor

Figure 13A:
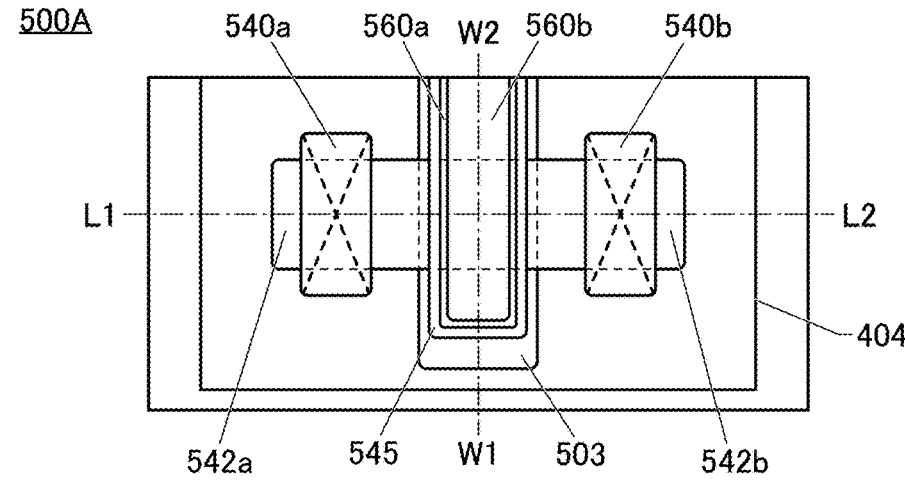
FIG. 13A to FIG. 13C are diagrams illustrating a structure example of a transistor.
Figure 13B:
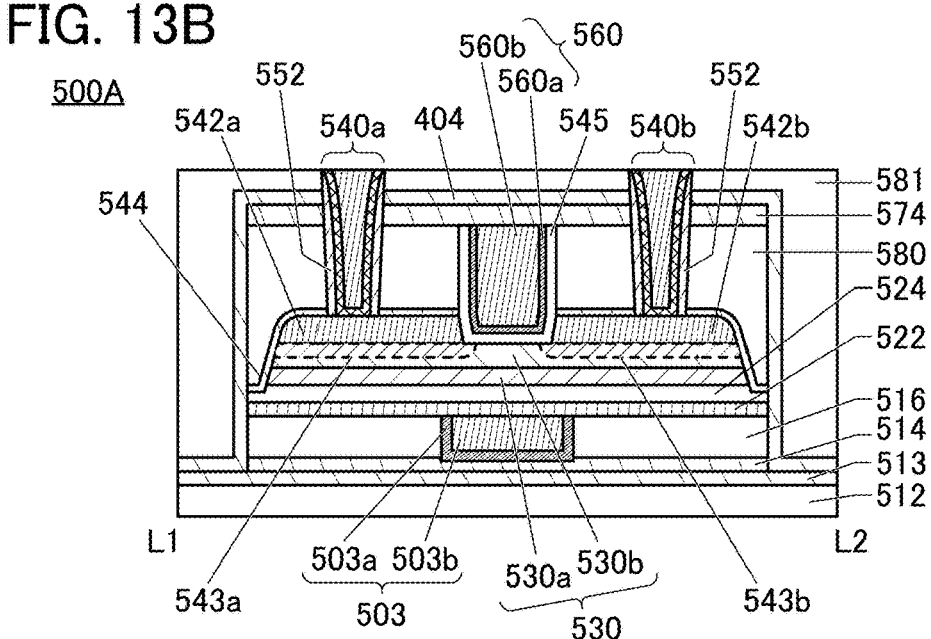
Figure 13C:
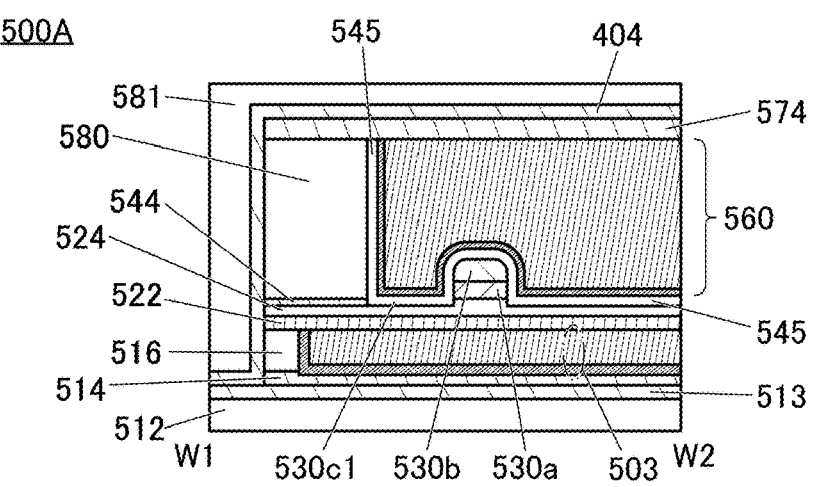

A transistor 500A illustrated in FIG. 13A to FIG. 13C is a modification example of the transistor 500 having the structure illustrated in FIG. 12A and FIG. 12B. FIG. 13A is a top view of the transistor 500A, FIG. 13B is a cross-sectional view of the transistor 500A in a channel length direction, and FIG. 13C is a cross-sectional view of the transistor 500A in a channel width direction. Note that for clarity of the drawing, some components are not illustrated in the top view of FIG. 13A. Note that the structure illustrated in FIG. 13A to FIG. 13C can also be employed for other transistors such as the transistor 550 included in the semiconductor device according to one embodiment of the present invention.

The transistor 500A illustrated in FIG. 13A to FIG. 13C is different from the transistor 500 having the structure illustrated in FIG. 12A and FIG. 12B in including an insulator 552, an insulator 513, and an insulator 404. The transistor 500A is different from the transistor 500 also in that the insulator 552 is provided in contact with a side surface of the conductor 540a and a side surface of the conductor 540b. The transistor 500A is different from the transistor 500 also in not including the insulator 520.

In the transistor 500A having the structure illustrated in FIG. 13A to FIG. 13C, the insulator 513 is provided over the insulator 512. In addition, the insulator 404 is provided over the insulator 574 and the insulator 513.

In the transistor 500A having the structure illustrated in FIG. 13A to FIG. 13C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide, which is a material having a high hydrogen barrier property, is preferably used. This can inhibit diffusion of hydrogen or the like into the oxide 530, thereby suppressing the degradation of the characteristics of the transistor 500A. Consequently, the reliability of the semiconductor device according to one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or a water molecule. For example, for the insulator 552, an insulator such as silicon nitride, aluminum oxide, or silicon nitride oxide that is a material having a high hydrogen barrier property is preferably used. In particular, it is suitable to use silicon nitride for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device according to one embodiment of the present invention can be increased.

Modification Example 2 of Transistor

Figure 14A:
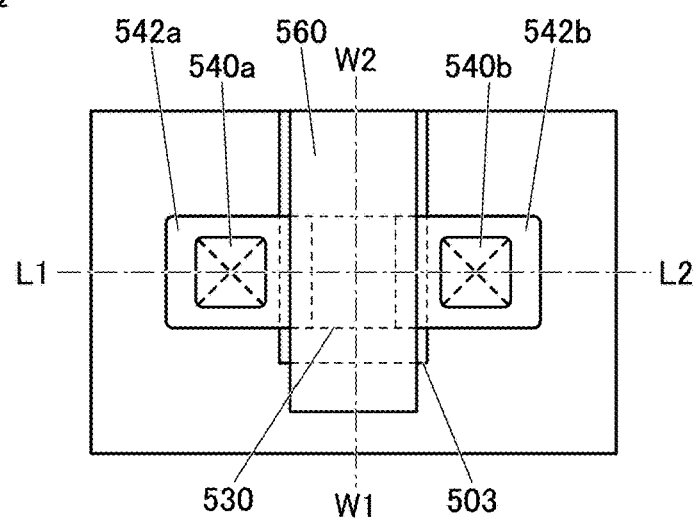
FIG. 14A to FIG. 14C are diagrams illustrating a structure example of a transistor.
Figure 14B:
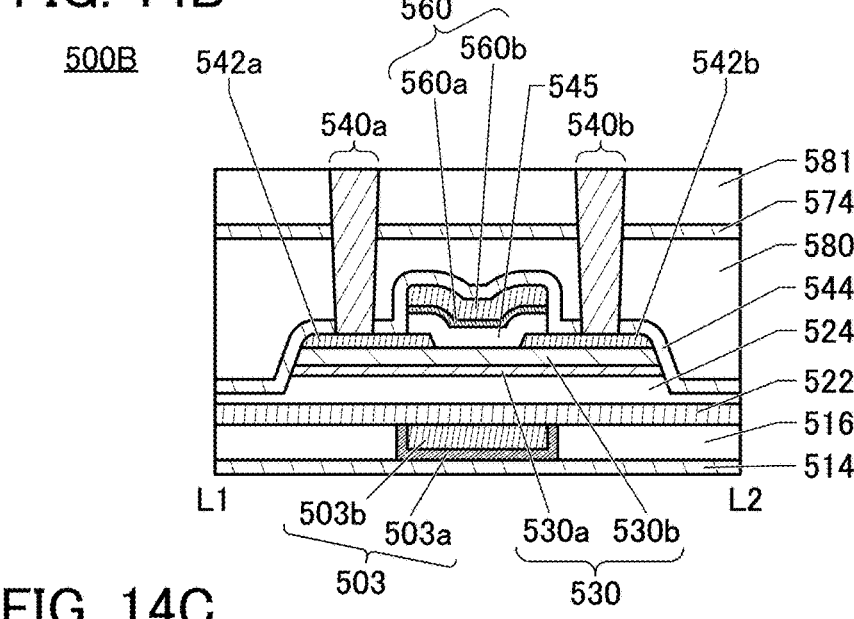
Figure 14C:
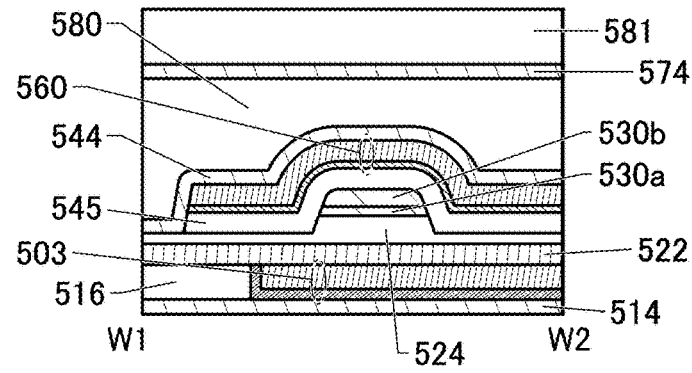

A structure example of a transistor 500B is described using FIG. 14A, FIG. 14B, and FIG. 14C. FIG. 14A is a top view of the transistor 500B. FIG. 14B is a cross-sectional view of a portion indicated by dashed-dotted line L1-L2 in FIG. 14A. FIG. 14C is a cross-sectional view of a portion indicated by a dashed-dotted line W1-W2 in FIG. 14A. Note that for clarity of the drawing, some components are not illustrated in the top view of FIG. 14A.

The transistor 500B is a modification example of the transistor 500 and can be replaced with the transistor 500. Therefore, differences from the transistor 500 are mainly described to avoid repeated description.

The conductor 560 functioning as the first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, when the conductor 560a is included, oxidation of the conductor 560b is inhibited, so that a decrease in conductivity can be prevented.

In addition, the insulator 544 is preferably provided to cover the top surface and a side surface of the conductor 560 and a side surface of the insulator 545. Note that for the insulator 544, an insulating material having a function of inhibiting diffusion of oxygen and impurities such as water and hydrogen is preferably used. For example, aluminum oxide, hafnium oxide, or the like is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like can be used.

Providing the insulator 544 can inhibit oxidation of the conductor 560. In addition, when the insulator 544 is included, diffusion of impurities such as water and hydrogen contained in the insulator 580 into the transistor 500B can be inhibited.

The transistor 500B has the conductor 560 overlapping part of the conductor 542a and part of the conductor 542b, and thus tends to have larger parasitic capacitance than the transistor 500. Thus, the transistor 500B tends to have lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments and the like.

Embodiment 4

In this embodiment, an oxide semiconductor, which is one kind of metal oxide, will be described.

A metal oxide preferably contains at least indium or zinc. In particular, indium and zinc are preferably contained. In addition, in addition to these, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor is described using FIG. 15A. FIG. 15A is a diagram showing the classification of crystal structures of an oxide semiconductor, typically IGZO (a metal oxide containing In, Ga, and Zn).

As shown in FIG. 15A, an oxide semiconductor is roughly classified into "Amorphous," "Crystalline," and "Crystal." In addition, the term "Amorphous" includes completely amorphous. Furthermore, the term "Crystalline" includes CAAC (c-axis-aligned crystalline), nc (nanocrystalline), and CAC (cloud-aligned composite) (excluding single crystal and poly crystal). Note that in the classification of "Crystalline," single crystal, poly crystal, and completely amorphous are excluded. Moreover, the term "Crystal" includes single crystal and poly crystal. Note that the structures in the thick frame shown in FIG. 15A are in an intermediate state between "Amorphous" and "Crystal," and belong to a new boundary region (new crystalline phase). In other words, these structures can be rephrased as structures completely different from "Amorphous," which is energetically unstable, and "Crystal."

Note that a crystal structure of a film or a substrate can be evaluated with an X-Ray Diffraction (XRD) spectrum. Here, FIG. 15B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method. The XRD spectrum that is shown in FIG. 15B and obtained by GIXD measurement is hereinafter simply referred to as an XRD spectrum. Note that the CAAC-IGZO film shown in FIG. 15B has a composition in the vicinity of In:Ga:Zn=4:2:3 [atomic ratio]. In addition, the thickness of the CAAC-IGZO film shown in FIG. 15B is 500 nm.

As shown in FIG. 15B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. Note that as shown in FIG. 15B, the peak at 2θ of around 31° is asymmetric with respect to the axis of an angle at which peak intensity (Intensity) is detected.

A crystal structure of a film or a substrate can also be evaluated with a diffraction pattern observed by a nanobeam electron diffraction (NBED) method (such a pattern is also referred to as a nanobeam electron diffraction pattern). FIG. 15C shows a diffraction pattern of the CAAC-IGZO film. FIG. 15C shows a diffraction pattern observed by NBED in which an electron beam is incident in a direction parallel to the substrate. Note that the CAAC-IGZO film shown in FIG. 15C has a composition in the vicinity of In:Ga:Zn=4:2:3 [atomic ratio]. In addition, in the nanobeam electron diffraction method, electron diffraction is performed with a probe diameter of 1 nm.

As shown in FIG. 15C, a plurality of spots indicating c-axis alignment are observed in the diffraction pattern of the CAAC-IGZO film.

<<Structure of Oxide Semiconductor>>

Note that oxide semiconductors might be classified in a manner different from that in FIG. 15A when classified in terms of the crystal structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductor include a polycrystalline oxide semiconductor, an amorphous-like oxide semiconductor (a-like OS), an amorphous oxide semiconductor, and the like.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of a surface where the CAAC-OS film is formed, or the normal direction of the surface of the CAAC-OS film. In addition, the crystal region refers to a region having periodic atomic arrangement. Note that when atomic arrangement is regarded as lattice arrangement, the crystal region also refers to a region with uniform lattice arrangement. Furthermore, the CAAC-OS has a region where a plurality of crystal regions are connected in an a-b plane direction, and the region has distortion in some cases. Note that distortion refers to a portion where the direction of lattice arrangement changes between a region with uniform lattice arrangement and another region with uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. Alternatively, in the case where the crystal region is formed of a large number of fine crystals, the size of the crystal region is sometimes approximately several tens of nanometers.

In addition, in an In-M-Zn oxide (the element M is one kind or a plurality of kinds selected from aluminum, gallium, yttrium, tin, titanium, and the like), the CAAC-OS tends to have a layer-shaped crystal structure (also referred to as a layer-shaped structure) in which a layer containing indium (In) and oxygen (hereinafter an In layer) and a layer containing the element M, zinc (Zn), and oxygen (hereinafter an (M,Zn) layer) are stacked. Note that indium and the element M can be replaced with each other. Therefore, indium is sometimes contained in the (M,Zn) layer. Furthermore, the element M is sometimes contained in the In layer. Note that Zn is sometimes contained in the In layer. Such a layer-shaped structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) might fluctuate depending on the kind, composition, or the like of the metal element contained in the CAAC-OS.

In addition, for example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, lattice arrangement in the crystal region is basically hexagonal lattice arrangement; however, a unit lattice is not always a regular hexagon and is a non-regular hexagon in some cases. In addition, pentagonal lattice arrangement, heptagonal lattice arrangement, and the like are included in the distortion in some cases. Note that a clear grain boundary cannot be observed even in the vicinity of the distortion in the CAAC-OS. That is, it is found that formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, it can be said that a reduction in electron mobility due to the grain boundary is unlikely to occur. In addition, entry of impurities, formation of defects, or the like might decrease the crystallinity of an oxide semiconductor. This means that the CAAC-OS can also be referred to as an oxide semiconductor having small amounts of impurities and defects (oxygen vacancies or the like). Therefore, physical properties of an oxide semiconductor including the CAAC-OS become stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. In addition, there is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are obtained in the observed electron diffraction pattern when the nc-OS film is subjected to electron diffraction (also referred to as nanobeam electron diffraction) using an electron beam with a probe diameter close to or smaller than the size of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. In addition, the second region includes gallium oxide, gallium zinc oxide, or the like as its main component. That is, the first region can be referred to as a region containing In as its main component. Furthermore, the second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

Oxide semiconductors have various structures and each have different properties. Two or more kinds among the amorphous oxide semiconductor, the polycrystalline oxide semiconductor, the a-like OS, the CAC-OS, the nc-OS, and the CAAC-OS may be included in an oxide semiconductor according to one embodiment of the present invention.
<Transistor Including Oxide Semiconductor>

Next, the case where the oxide semiconductor is used for a transistor is described.

When the oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

In addition, a highly purified intrinsic or substantially highly purified intrinsic oxide semiconductor film has a low density of defect states and accordingly has a low density of trap states in some cases.

In addition, electric charge captured by the trap states in an oxide semiconductor takes a long time to disappear and might behave like fixed electric charge. Thus, a transistor whose channel formation region is formed in an oxide semiconductor having a high density of trap states has unstable electrical characteristics in some cases.

Accordingly, in order to stabilize electrical characteristics of the transistor, reducing the concentration in the oxide semiconductor is effective. In addition, in order to reduce the impurity concentration in the oxide semiconductor, the impurity concentration in a film that is adjacent to the oxide semiconductor is also preferably reduced. Examples of impurities include hydrogen, nitrogen, an alkali metal, an alkaline earth metal, iron, nickel, silicon, and the like.
<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

In addition, when the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor that is obtained by SIMS is lower than or equal to $1\times10^{18}$ atoms/cm$^3$, preferably lower than or equal to $2\times10^{16}$ atoms/cm$^3$.

In addition, an oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. Alternatively, when nitrogen is contained in the oxide semiconductor, a trap state is sometimes formed. This might make the electrical characteristics of the transistor unstable. Therefore, the concentration of nitrogen in the oxide semiconductor that is obtained by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, some hydrogen is bonded to oxygen bonded to a metal atom and generates an electron serving as a carrier. Thus, a transistor using an oxide semiconductor that contains hydrogen tends to have normally-on characteristics. For this reason, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical character- istics.

The composition, structure, method, and the like described in this embodiment can be used in combination as appropriate with the compositions, structures, methods, and the like described in the other embodiments and the like.

Embodiment 5

In this embodiment, application examples of the above semiconductor device will be described.
[Semiconductor Wafer and Chip]

Figures 16A, 16B:
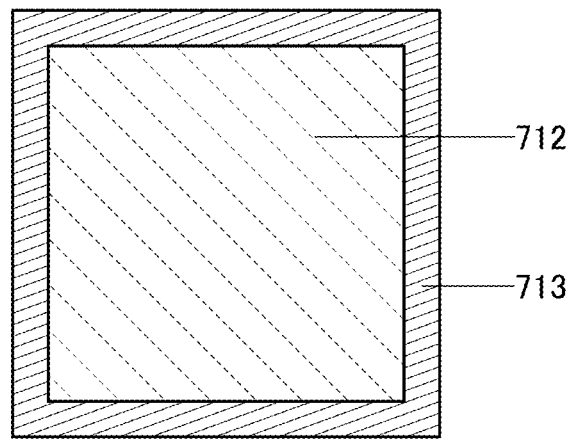
FIG. 16A is a top view of the semiconductor wafer.
FIG. 16B is an enlarged view of a chip.

FIG. 16A illustrates a top view of a substrate 711 before dicing treatment. As the substrate 711, a semiconductor substrate (also referred to as a "semiconductor wafer") can be used, for example. A plurality of circuit regions 712 are provided on the substrate 711. A semiconductor device according to one embodiment of the present invention, another functional circuit, or the like can be provided in the circuit region 712.

The plurality of circuit regions 712 are each surrounded by a separation region 713. Separation lines (also referred to as "dicing lines") 714 are set at a position overlapping the separation regions 713. The substrate 711 can be cut along the separation lines 714 into chips 715 including the circuit regions 712. FIG. 16B illustrates an enlarged view of the chip 715.

A conductor or a semiconductor layer may be provided in the separation regions 713. Providing a conductor or a semiconductor layer in the separation regions 713 relieves ESD that might be caused in a dicing step, which prevents a decrease in the yield of the dicing step. In addition, a dicing step is generally performed while pure water whose specific resistance is decreased by dissolution of a carbonic acid gas or the like is supplied to a cut portion, in order to cool down a substrate, remove swarf, and prevent electrification, for example. Providing a conductor or a semiconductor layer in the separation regions 713 allows a reduction in the usage of the pure water. Therefore, the cost of manufacturing the semiconductor device can be reduced. Moreover, the pro- ductivity of the semiconductor device can be increased.

For a semiconductor layer provided in the separation regions 713, a material having a band gap of more than or equal to 2.5 eV and less than or equal to 4.2 eV, preferably more than or equal to 2.7 eV and less than or equal to 3.5 eV is preferably used. The use of such a material allows accumulated charge to be released slowly; thus, the rapid move of charge due to ESD can be inhibited and electrostatic breakdown is less likely to occur.
[Electronic Component]

An example where the chip 715 is applied to an electronic component will be described using FIG. 17. Note that the electronic component is also referred to as a semiconductor package or an IC package. The electronic component has a plurality of standards and names depending on a terminal extraction direction and a terminal shape.

The electronic component is completed when the semi- conductor device described in the above embodiment is combined with components other than the semiconductor device in an assembly process (post-process).

Figure 17A:
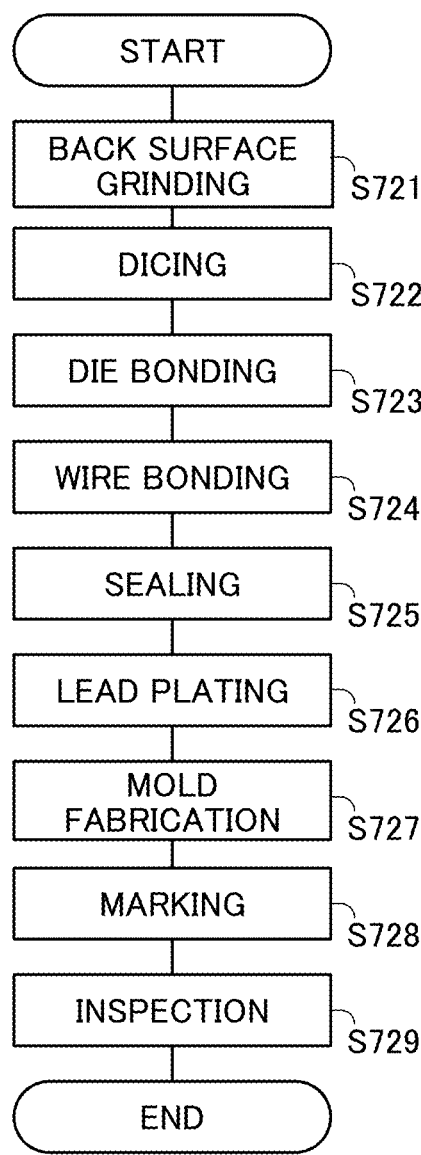
FIG. 17A is a flow chart describing an example of a process for manufacturing an electronic component.

The post-process is described using a flow chart in FIG. 17A. After an element substrate including the semiconductor device described in the above embodiment is completed in a pre-process, a "back surface grinding step" in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, a "dicing step" of dividing the element substrate into a plurality of chips (chips 715) is performed (Step S722). Then, a "die bonding step" of separately picking up the divided chips and bonding the chips onto a lead frame is performed (Step S723). To bond a chip and a lead frame in the die bonding step, a method such as bonding with resin or bonding with a tape is selected as appropriate depending on products. Note that the chip may be bonded onto an interposer substrate instead of the lead frame.

Next, a "wire bonding step" of electrically connecting a lead of the lead frame and an electrode on the chip through a metal fine line (wire) is performed (Step S724). A silver line or a gold line can be used as the metal fine line. In addition, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with resin, so that a circuit portion incorporated in the chip and a wire for connecting the chip to the lead can be protected from external mechani- cal force, and degradation of characteristics (a decrease in reliability) due to moisture or dust can be reduced.

Subsequently, a "lead plating step" of plating the lead of the lead frame is performed (Step S726). This plating treatment prevents rust of the lead and enables more reliable soldering at the time of mounting the electronic component on a printed circuit board later. Then, a "mold fabrication step" of cutting and mold fabrication of the lead is per- formed (Step S727).

Next, a "marking step" of printing (marking) on a surface of the package is performed (Step S728). After an "inspec- tion step" (Step S729) for checking whether an external shape is good and whether there is malfunction, for example, the electronic component is completed.

Figure 17B:
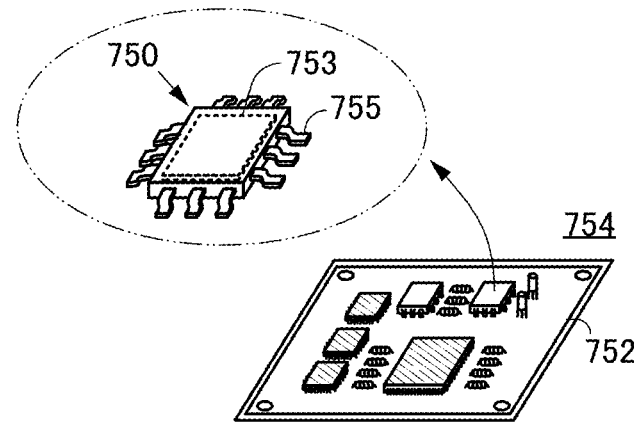
FIG. 17B is a schematic perspective view of an electronic component.

FIG. 17B illustrates a schematic perspective view of a completed electronic component. FIG. 17B illustrates a schematic perspective view of a QFP (Quad Flat Package) as an example of the electronic component. In an electronic component 750 illustrated in FIG. 17B, a lead 755 and a semiconductor device 753 are shown. As the semiconductor device 753, the semiconductor device described in the above embodiment or the like can be used.

The electronic component 750 illustrated in FIG. 17B is mounted on a printed circuit board 752, for example. A plurality of electronic components 750 are combined and electrically connected to each other over the printed circuit board 752; thus, a substrate on which the electronic com- ponents are mounted (a mounting board 754) is completed. The completed mounting board 754 is used for an electronic device or the like.

[Electronic Device]

Next, examples of electronic devices each including the semiconductor device according to one embodiment of the present invention or the above electronic component will be described.

Examples of electronic devices each including the semiconductor device according to one embodiment of the present invention or the electronic component include display devices of televisions, monitors, and the like; lighting devices; desktop personal computers; laptop personal computers; word processors; image reproduction devices that reproduce still images and moving images stored in recording media such as DVDs (Digital Versatile Disc); portable CD players; radios; tape recorders; headphone stereos; stereos; table clocks; wall clocks; cordless phone handsets; transceivers; cellular phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling power and smart grid.

In addition, moving objects and the like driven by electric motors using power from the power storage devices are also included in the category of electronic devices. Examples of the moving objects include electric vehicles (EV), hybrid electric vehicles (HEV) that include both an internal-combustion engine and a motor, plug-in hybrid electric vehicles (PHEV), tracked vehicles in which caterpillar tracks are substituted for tired wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The semiconductor device according to one embodiment of the present invention or the electronic component can be used for a communication device or the like incorporated in the electronic devices.

The electronic devices may each include a sensor (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, vibration, odor, or infrared rays), for example.

The electronic device can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading a program or data stored in a recording medium.

Figure 18:
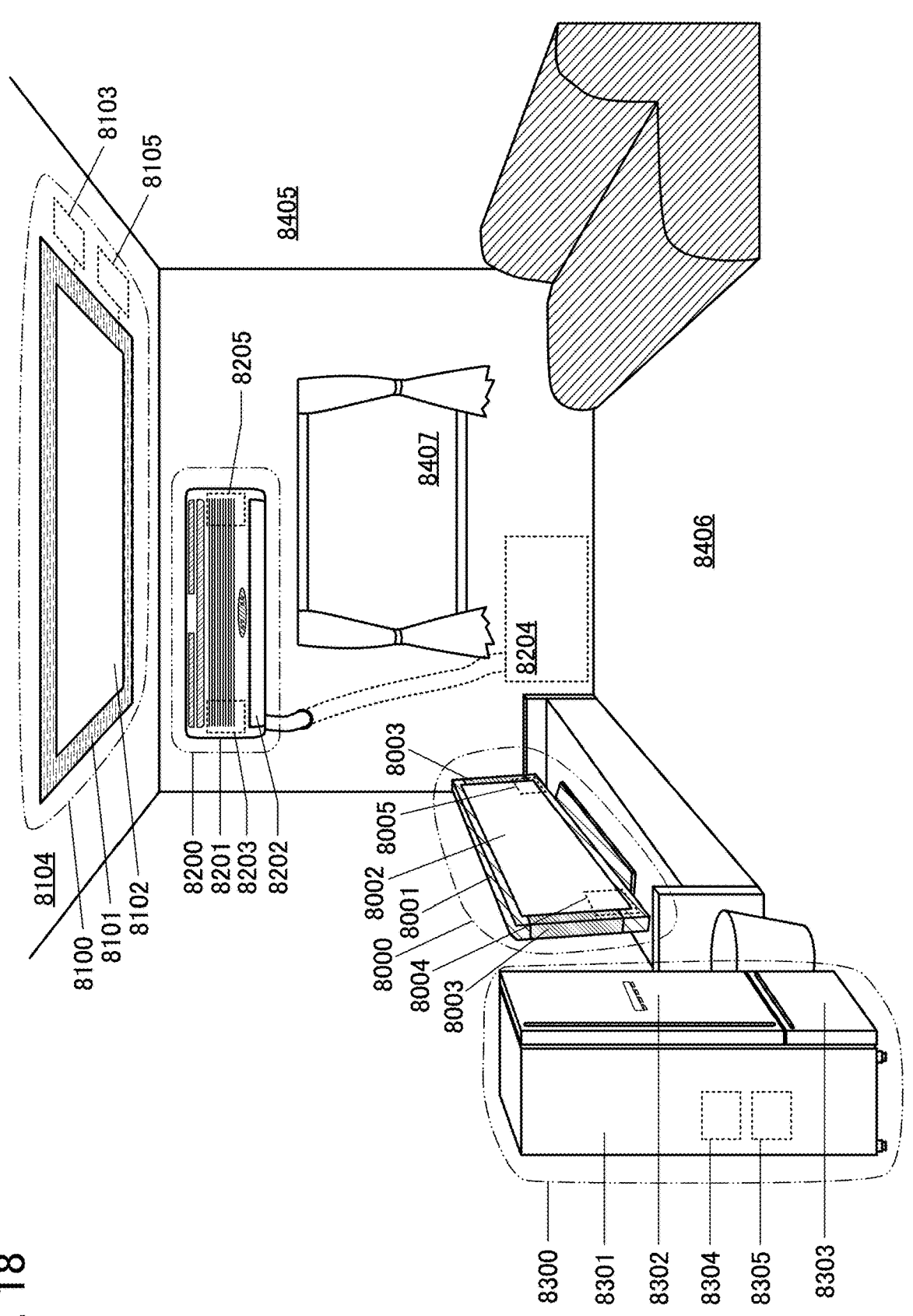
FIG. 18 is a diagram illustrating examples of electronic devices.

FIG. 18 and FIG. 19A to FIG. 19F illustrate examples of electronic devices. In FIG. 18, a display device 8000 is an example of an electronic device using a semiconductor device 8004 according to one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 according to one embodiment of the present invention is provided in the housing 8001. The semiconductor device 8004 can retain control information, a control program, or the like. In addition, the semiconductor device 8004 has a communication function, and the display device 8000 can function as an IoT device. Moreover, the display device 8000 can receive power from a commercial power supply or can use power stored in the power storage device 8005.

A display device such as a liquid crystal display device, a light-emitting display device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that the display device includes all of information display devices for personal computers, advertisement displays, and the like besides TV broadcast reception.

In FIG. 18, an installation lighting device 8100 is an example of an electronic device using a semiconductor device 8103 according to one embodiment of the present invention. Specifically, the lighting device 8100 includes a housing 8101, a light source 8102, the semiconductor device 8103, a power storage device 8105, and the like. Although FIG. 18 illustrates the case where the semiconductor device 8103 is provided in a ceiling 8104 on which the housing 8101 and the light source 8102 are installed, the semiconductor device 8103 may be provided in the housing 8101. The semiconductor device 8103 can retain information such as emission luminance of the light source 8102, a control program, or the like. In addition, the semiconductor device 8103 has a communication function, and the lighting device 8100 can function as an IoT device. Furthermore, the lighting device 8100 can receive power from a commercial power supply or can use power stored in the power storage device.

Note that although FIG. 18 illustrates the installation lighting device 8100 provided in the ceiling 8104 as an example, the semiconductor device according to one embodiment of the present invention can be used in an installation lighting device provided in, for example, a side wall 8405, a floor 8406, a window 8407, or the like other than the ceiling 8104, or a tabletop lighting device or the like.

Moreover, as the light source 8102, an artificial light source that emits light artificially by using power can be used. Specific examples of the artificial light source include an incandescent lamp, a discharge lamp such as a fluorescent lamp, and light-emitting elements such as an LED and an organic EL element.

In FIG. 18, an air conditioner including an indoor unit 8200 and an outdoor unit 8204 is an example of an electronic device using a semiconductor device 8203 according to one embodiment of the present invention. Specifically, the indoor unit 8200 includes a housing 8201, an air outlet 8202, the semiconductor device 8203, a power storage device 8205, and the like. Although FIG. 18 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control information, a control program, or the like of the air conditioner. In addition, the semiconductor device 8203 has a communication function, and the air conditioner can function as an IoT device. Furthermore, the air conditioner can receive power from a commercial power supply or can use power stored in the power storage device 8205.

Note that although FIG. 18 illustrates the split-type air conditioner including the indoor unit and the outdoor unit as an example, the semiconductor device according to one embodiment of the present invention can be used in a unified-type air conditioner in which the functions of an indoor unit and an outdoor unit are included in one housing.

In FIG. 18, an electric refrigerator-freezer 8300 is an example of an electronic device using a semiconductor device 8304 according to one embodiment of the present invention. Specifically, the electric refrigerator-freezer 8300 includes a housing 8301, a refrigerator door 8302, a freezer door 8303, the semiconductor device 8304, a power storage device 8305, and the like. In FIG. 18, the power storage device 8305 is provided in the housing 8301. The semiconductor device 8304 can retain control information, a control program, or the like of the electric refrigerator-freezer 8300. In addition, the semiconductor device 8304 has a communication function, and the electric refrigerator-freezer 8300 can function as an IoT device. Furthermore, the electric refrigerator-freezer 8300 can receive power from a commercial power supply or can use power stored in the power storage device 8305.

Figure 19A:
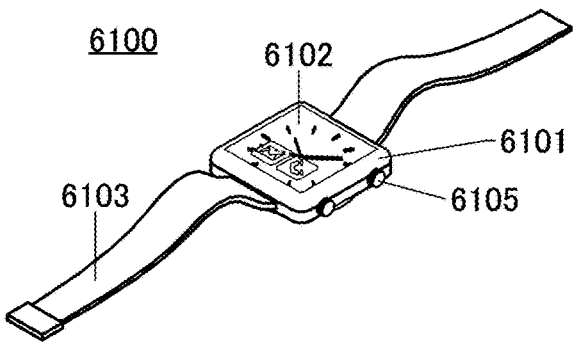
FIG. 19A to FIG. 19F are diagrams illustrating examples of electronic devices.

FIG. 19A illustrates an example of a watch-type portable information terminal. A portable information terminal 6100 includes a housing 6101, a display portion 6102, a band 6103, operation buttons 6105, and the like. The portable information terminal 6100 further includes a secondary battery and the semiconductor device according to one embodiment of the present invention or the electronic component. By using the semiconductor device according to one embodiment of the present invention or the electronic component for the portable information terminal 6100, the portable information terminal 6100 can function as an IoT device.

Figure 19B:
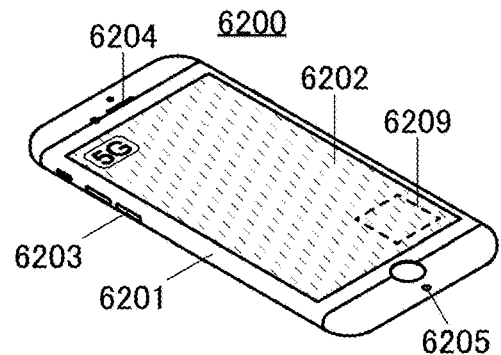

FIG. 19B illustrates an example of a cellular phone. A portable information terminal 6200 includes, in addition to a display portion 6202 incorporated in a housing 6201, operation buttons 6203, a speaker 6204, a microphone 6205, and the like.

The portable information terminal 6200 further includes a fingerprint sensor 6209 in a region overlapping the display portion 6202. The fingerprint sensor 6209 may be an organic optical sensor. Since fingerprints differ between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device according to one embodiment of the present invention or the electronic component. By using the semiconductor device according to one embodiment of the present invention or the electronic component for the portable information terminal 6200, the portable information terminal 6200 can function as an IoT device.

Figure 19C:
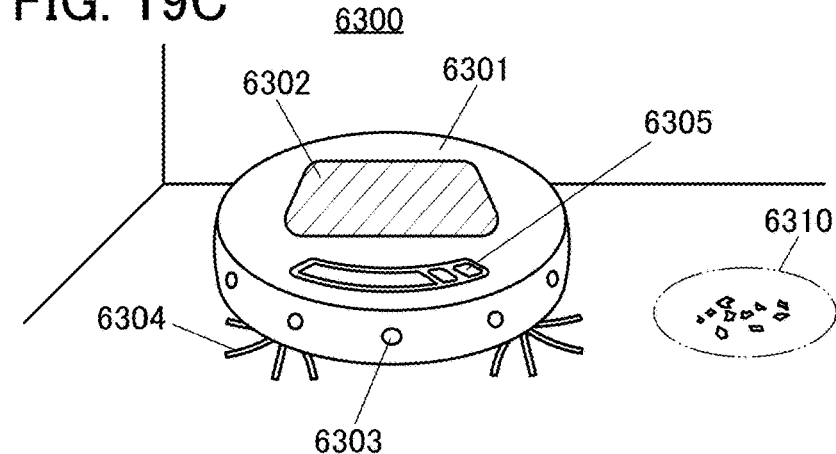

FIG. 19C illustrates an example of a cleaning robot. A cleaning robot 6300 includes a display portion 6302 placed on a top surface of a housing 6301, a plurality of cameras 6303 placed on a side surface of the housing 6301, a brush 6304, operation buttons 6305, a variety of sensors, and the like. Although not illustrated, the cleaning robot 6300 is provided with a tire, an inlet, and the like. The cleaning robot 6300 is self-propelled, detects dust 6310, and sucks up the dust through the inlet provided on a bottom surface.

For example, the cleaning robot 6300 can determine whether there is an obstacle such as a wall, furniture, or a step by analyzing images taken by the cameras 6303. In addition, in the case where an object that is likely to be caught in the brush 6304, such as a wiring, is detected by image analysis, the rotation of the brush 6304 can be stopped. The cleaning robot 6300 includes a secondary battery and the semiconductor device according to one embodiment of the present invention or the electronic component. By using the semiconductor device according to one embodiment of the present invention or the electronic component for the cleaning robot 6300, the cleaning robot 6300 can function as an IoT device.

Figure 19D:
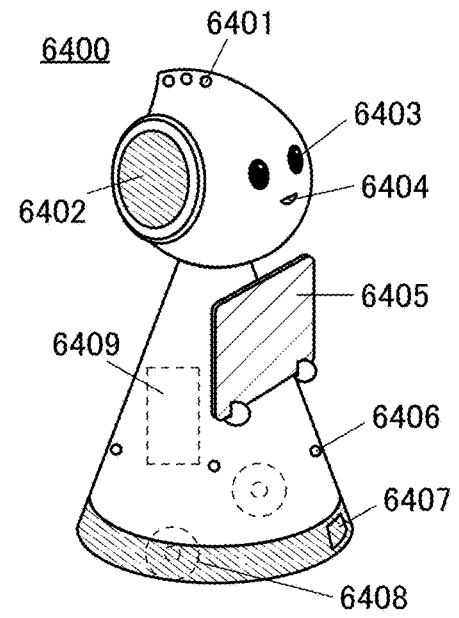

FIG. 19D illustrates an example of a robot. A robot 6400 illustrated in FIG. 19D includes an arithmetic unit 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. In addition, the speaker 6404 has a function of outputting sound. The robot 6400 can communicate with the user using the microphone 6402 and the speaker 6404.

The display portion 6405 has a function of displaying various kinds of information. The robot 6400 can display information desired by the user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 have a function of taking an image of the surroundings of the robot 6400. In addition, the obstacle sensor 6407 can sense whether there is an obstacle in a direction where the robot 6400 advances with the moving mechanism 6408. The robot 6400 can move safely by recognizing the surroundings with the upper camera 6403, the lower camera 6406, and the obstacle sensor 6407. The light-emitting device according to one embodiment of the present invention can be used for the display portion 6405.

The robot 6400 includes a secondary battery and the semiconductor device according to one embodiment of the present invention or the electronic component. By using the semiconductor device according to one embodiment of the present invention or the electronic component for the robot 6400, the robot 6400 can function as an IoT device.

Figure 19E:
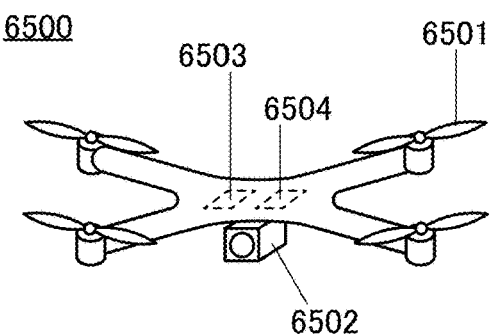

FIG. 19E illustrates an example of a flying object. A flying object 6500 illustrated in FIG. 19E includes propellers 6501, a camera 6502, a battery 6503, and the like and has a function of flying autonomously.

For example, image data taken by the camera 6502 is stored in an electronic component 6504. The electronic component 6504 can analyze the image data to sense whether there is an obstacle in the way of movement. Moreover, the electronic component 6504 can estimate the remaining battery level from a change in the power storage capacity of the battery 6503. The flying object 6500 includes the semiconductor device according to one embodiment of the present invention or the electronic component. By using the semiconductor device according to one embodiment of the present invention or the electronic component for the flying object 6500, the flying object 6500 can function as an IoT device.

Figure 19F:
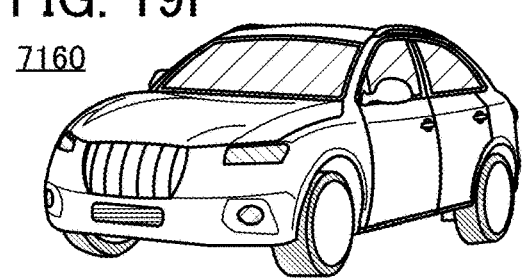

FIG. 19F illustrates an example of a motor vehicle. A motor vehicle 7160 includes an engine, tires, a brake, a steering gear, a camera, and the like. The motor vehicle 7160 further includes the semiconductor device according to one embodiment of the present invention or the electronic component. By using the motor vehicle 7160 including the semiconductor device according to one embodiment of the present invention or the electronic component, the motor vehicle 7160 can function as an IoT device.

The composition, structure, method, and the like described in this embodiment can be used in combination as appropriate with the compositions, structures, methods, and the like described in the other embodiments.

Embodiment 6

A normally-off CPU (also referred to as "Noff-CPU") can be achieved using the OS transistor described in this specification and the like. Note that the Noff-CPU is an integrated circuit including a normally-off transistor, which is in a non-conducting state (also referred to as an off state) even when gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain information necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operation speed.

The Noff-CPU can be suitably used for a small-scale system such as an IoT (Internet of Things) end device (also referred to as an "endpoint microcomputer") 803 in the IoT field, for example.

Figure 20:
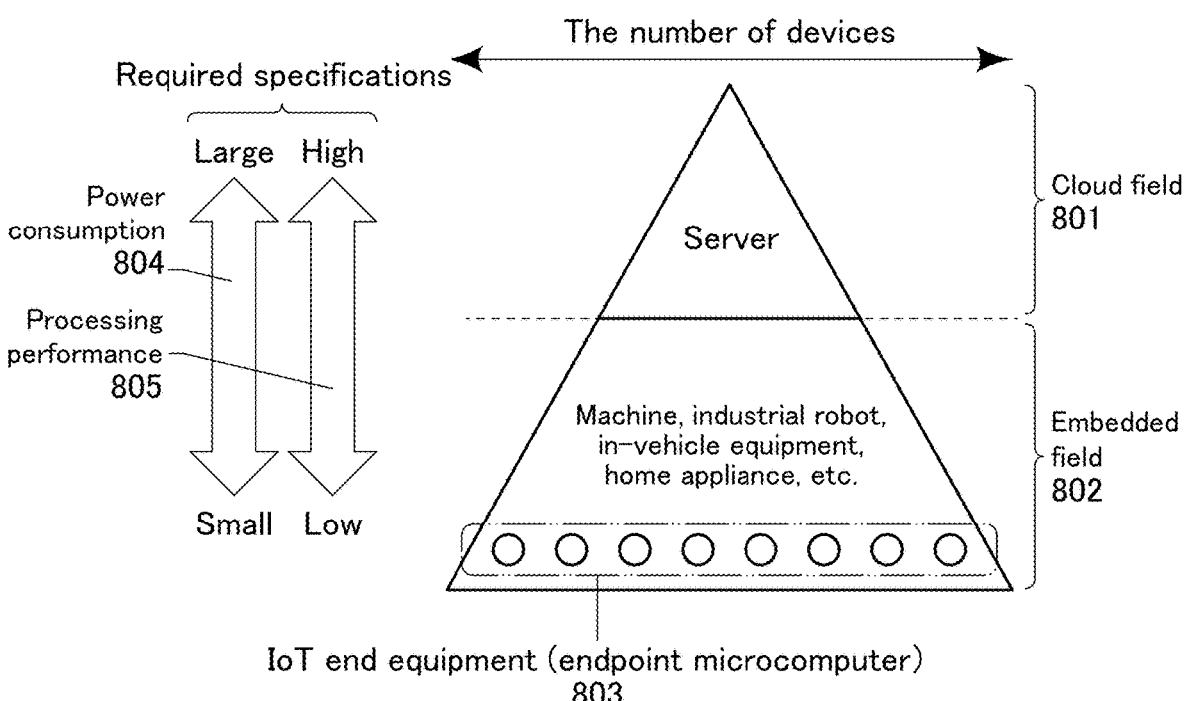
FIG. 20 is a diagram illustrating a hierarchical structure of an IoT network and tendencies of required specifications.

FIG. 20 shows a hierarchical structure of an IoT network and tendencies of required specifications. FIG. 20 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, a home appliance, and the like, for example.

Higher processing performance is required rather than lower power consumption at the upper level. Thus, a high-performance CPU, a high-performance GPU, a large-scale SoC, and the like are used in the cloud field 801. Furthermore, lower power consumption is required rather than higher processing performance at the lower level where the number of devices is explosively increased. The semiconductor device according to one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 21:
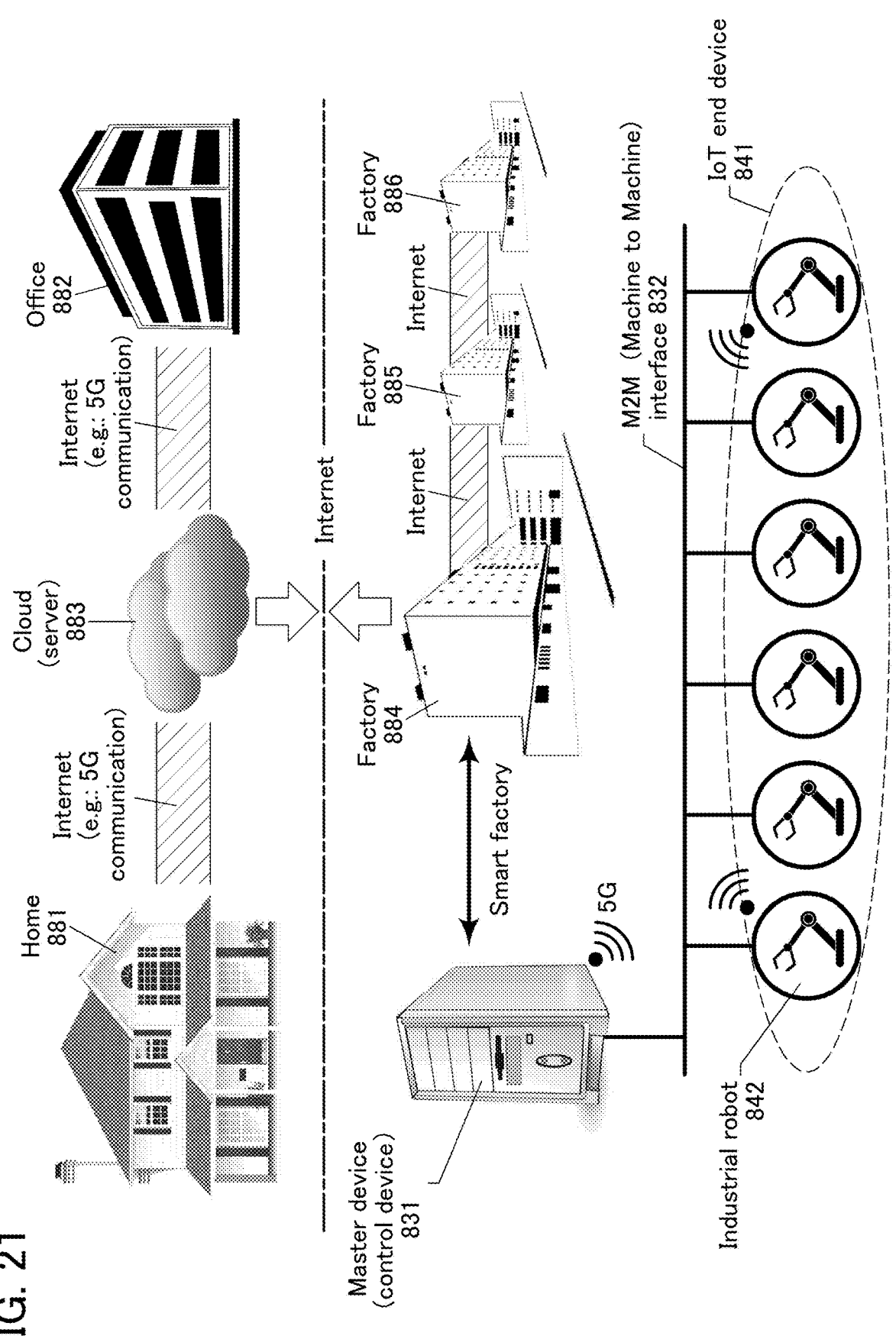
FIG. 21 is an image diagram of factory automation.

FIG. 21 shows an image diagram of factory automation as an application example of the endpoint microcomputer. A factory 884 is connected to a cloud 883 through Internet connection. In addition, the cloud 883 is connected to a home 881 and an office 882 through Internet connection. The Internet connection may be either wired communication or wireless communication. In the case of wireless communication, for example, wireless communication based on a communication standard such as the fourth-generation mobile communication system (4G) or the fifth-generation mobile communication system (5G) can be performed using the semiconductor device according to one embodiment of the present invention for a communication device. Furthermore, the factory 884 may be connected to a factory 885 and a factory 886 through Internet connection.

The factory 884 includes a master device (control device) 831. The master device 831 is connected to the cloud 883 and has a function of transmitting and receiving information. The master device 831 is also connected to a plurality of industrial robots 842 included in an IoT end device 841 through a M2M (Machine to Machine) interface 832. As the M2M interface 832, for example, industrial Ethernet ("Ethernet" is a registered trademark), which is a kind of wired communication, or local 5G, which is a kind of wireless communication, may be used.

A manager of the factory can know the operation status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory." Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in standby operation by the Noff-CPU. Meanwhile, although the embedded field of IoT sometimes requires quick response, the use of the Noff-CPU achieves high-speed return from standby operation.

The composition, structure, method, and the like described in this embodiment can be used in combination as appropriate with the compositions, structures, methods, and the like described in the other embodiments and the like. (Supplementary Notes on the Description in this Specification and the Like)

The description of the above embodiments and each structure in the embodiments are noted below.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) for the other of the source and the drain are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

10: wireless communication device, 100: semiconductor device, 101: current-to-voltage conversion portion, 102: current switch portion, 103: voltage-to-current conversion portion, 111: transistor, 112: semiconductor layer, 121: transistor, and 122: semiconductor layer.

The invention claimed is:

1. A semiconductor device comprising:
a current-to-voltage conversion portion;
a current switch portion; and
a voltage-to-current conversion portion,
wherein the current switch portion includes a first transistor,
wherein the voltage-to-current conversion portion includes a second transistor,
wherein the first transistor includes an oxide semiconductor in a channel formation region,
wherein the second transistor includes a nitride semiconductor in a channel formation region, and
wherein the first transistor is above the second transistor.

2. The semiconductor device according to claim 1, wherein the current-to-voltage conversion portion includes a resistor.

3. The semiconductor device according to claim 1,
wherein the voltage-to-current conversion portion includes a fourth transistor and an inductor,
wherein one of a source and a drain of the fourth transistor is electrically connected to a first terminal of the inductor,
wherein a second terminal of the inductor is electrically connected to a gate of the second transistor, and
wherein the fourth transistor includes an oxide semiconductor in a channel formation region.

4. The semiconductor device according to claim 1, wherein frequency of a signal supplied to a gate of the first transistor is higher than frequency of a signal supplied to the gate of the second transistor.

5. The semiconductor device according to claim 1, wherein the oxide semiconductor contains indium, gallium, and zinc.

6. The semiconductor device according to claim 1, wherein the nitride semiconductor contains gallium.

7. A semiconductor device comprising:
a current-to-voltage conversion portion;
a current switch portion;
a voltage-to-current conversion portion; and
a control portion,
wherein the current switch portion includes a first transistor,
wherein the voltage-to-current conversion portion includes a second transistor,
wherein the control portion includes a third transistor,
wherein the first transistor includes an oxide semiconductor in a channel formation region,
wherein the second transistor includes a nitride semiconductor in a channel formation region,
wherein the third transistor includes silicon in a channel formation region, and
wherein the first transistor is above the second transistor and the third transistor.

8. The semiconductor device according to claim 7, wherein the current-to-voltage conversion portion includes a resistor.

9. The semiconductor device according to claim 7,
wherein the voltage-to-current conversion portion includes a fourth transistor and an inductor,
wherein one of a source and a drain of the fourth transistor is electrically connected to a first terminal of the inductor,
wherein a second terminal of the inductor is electrically connected to a gate of the second transistor, and
wherein the fourth transistor includes an oxide semiconductor in a channel formation region.

10. The semiconductor device according to claim 7, wherein frequency of a signal supplied to a gate of the first transistor is higher than frequency of a signal supplied to the gate of the second transistor.

11. The semiconductor device according to claim 7, wherein the oxide semiconductor contains indium, gallium, and zinc.

12. The semiconductor device according to claim 7, wherein the nitride semiconductor contains gallium.

13. A semiconductor device comprising:
a current-to-voltage conversion portion;
a current switch portion;
a voltage-to-current conversion portion; and
a control portion,
wherein the current switch portion includes a first transistor,
wherein the voltage-to-current conversion portion includes a second transistor,
wherein the control portion includes a third transistor,
wherein the first transistor includes an oxide semiconductor in a channel formation region,
wherein the second transistor includes a nitride semiconductor in a channel formation region,
wherein the third transistor includes silicon in a channel formation region,
wherein the first transistor is provided over a first substrate,
wherein the second transistor and the third transistor are provided over a second substrate, and
wherein when the first substrate is attached to the second substrate, the first transistor to the third transistor are electrically connected.

14. The semiconductor device according to claim 13, wherein the current-to-voltage conversion portion includes a resistor.

15. The semiconductor device according to claim 13,
wherein the voltage-to-current conversion portion includes a fourth transistor and an inductor,
wherein one of a source and a drain of the fourth transistor is electrically connected to a first terminal of the inductor,
wherein a second terminal of the inductor is electrically connected to a gate of the second transistor, and
wherein the fourth transistor includes an oxide semiconductor in a channel formation region.

16. The semiconductor device according to claim 13, wherein frequency of a signal supplied to a gate of the first transistor is higher than frequency of a signal supplied to the gate of the second transistor.

17. The semiconductor device according to claim 13, wherein the oxide semiconductor contains indium, gallium, and zinc.

18. The semiconductor device according to claim 13, wherein the nitride semiconductor contains gallium.

\* \* \* \* \*